US009040219B2

(12) United States Patent
Taguchi et al.

(10) Patent No.: US 9,040,219 B2
(45) Date of Patent: May 26, 2015

(54) IMAGE FORMING MATERIAL, PLANOGRAPHIC PRINTING PLATE PRECURSOR, AND METHOD FOR MANUFACTURING A PLANOGRAPHIC PRINTING PLATE

(75) Inventors: Yoshinori Taguchi, Haibara-gun (JP); Noriaki Watanabe, Haibara-gun (JP); Shigekatsu Fujii, Haibara-gun (JP); Shigefumi Kanchiku, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/193,224

(22) Filed: Jul. 28, 2011

(65) Prior Publication Data

US 2012/0052445 A1 Mar. 1, 2012

(30) Foreign Application Priority Data

Aug. 31, 2010 (JP) ................................ 2010-195146
Feb. 22, 2011 (JP) ................................ 2011-035514

(51) Int. Cl.

*B41M 5/00* (2006.01)
*B41N 1/00* (2006.01)
*G03F 7/00* (2006.01)
*G03F 7/26* (2006.01)
*B41C 1/10* (2006.01)

(52) U.S. Cl.

CPC ........... *B41C 1/1016* (2013.01); *B41C 2210/02* (2013.01); *B41C 2210/06* (2013.01); *B41C 2210/14* (2013.01); *B41C 2210/22* (2013.01); *B41C 2210/24* (2013.01); *B41C 2210/262* (2013.01); *B41C 2210/266* (2013.01)

(58) Field of Classification Search

CPC .......... G03F 7/11; G03F 7/0045; B41N 3/036
USPC .......... 101/450.1, 453, 463.1; 430/270.1, 302
See application file for complete search history.

(56) References Cited

U.S. PATENT DOCUMENTS

| | | | | |
|---|---|---|---|---|
| 7,914,966 | B2 | 3/2011 | Savariar-Hauck et al. | |
| 2003/0075708 | A1 * | 4/2003 | Kodama | 252/582 |
| 2004/0101780 | A1 | 5/2004 | Maemoto | |
| 2007/0122743 | A1 * | 5/2007 | Maemoto | 430/270.1 |
| 2008/0044760 | A1 * | 2/2008 | Iwato et al. | 430/270.1 |
| 2008/0113296 | A1 * | 5/2008 | Yamamoto et al. | 430/280.1 |

FOREIGN PATENT DOCUMENTS

| | | | | |
|---|---|---|---|---|
| CN | 1499294 | | | 5/2004 |
| JP | 11-218914 | A | | 8/1999 |
| JP | 2005-181734 | A | | 7/2005 |
| JP | 2005181734 | A | * | 7/2005 |
| JP | 4057893 | B | * | 12/2007 |
| JP | 2009-237168 | A | | 10/2009 |

OTHER PUBLICATIONS

Office Action dated Jul. 8, 2014 in Chinese Office Application No. 201110213840.2.
Office Action dated Mar. 10, 2015 in corresponding Chinese Application No. 201110213840.2.

* cited by examiner

*Primary Examiner* — Chanceity Robinson
(74) *Attorney, Agent, or Firm* — Sughrue Mion, PLLC

(57) ABSTRACT

The invention provides an infrared-sensitive positive-working image forming material which provides excellent development latitude, image formability and image region strength, and in which decrease in development property is prevented even when a certain time has passed after pattern exposure until development treatment; an infrared-sensitive positive-working planographic printing plate precursor which is formed from the image forming material and has excellent image formability and image region printing durability; and a method for manufacturing a planographic printing plate using the planographic printing plate precursor. The image forming material includes; on a support, a lower layer containing a polymer having carboxylic acid groups at side chains thereof, at least a part of the carboxylic acid groups forming a salt structure with a monovalent basic compound, and an infrared absorbing agent; and an upper layer whose solubility to aqueous alkaline solution is increased by heat, in this order.

15 Claims, No Drawings

IMAGE FORMING MATERIAL, PLANOGRAPHIC PRINTING PLATE PRECURSOR, AND METHOD FOR MANUFACTURING A PLANOGRAPHIC PRINTING PLATE

CROSS-REFERENCE TO RELATED APPLICATION

This application claims priority under 35 USC 119 from Japanese Patent Application Nos. 2010-195146 filed on Aug. 31, 2010, and 2011-035514 filed on Feb. 22, 2011, the disclosures of which are incorporated by reference herein.

BACKGROUND OF THE INVENTION

1. Field of the Invention

The present invention relates to an infrared-sensitive image foaming material, an infrared-sensitive positive-working planographic printing plate precursor using the same, and a method for manufacturing a planographic printing plate.

2. Description of the Related Art

Conventionally, a variety of photosensitive compositions have been used as visible image forming materials or planographic printing plate materials. In particular, the recent development of lasers in the field of planographic printing has been outstanding and, particularly, regarding solid-state lasers or semiconductor lasers capable of emitting light in the range from near-infrared to infrared, high capacity and small sized lasers have become readily available. As an exposure light source for directly making a plate from digital data such as computer data, these lasers are very useful.

A positive planographic printing plate precursor for an infrared laser has an alkali-soluble binder resin, an infrared absorbing agent that absorbs light and generates heat, and the like, as essential components. In an unexposed region (i.e., an image portion), such an infrared absorbing agent or the like functions as a development inhibitor which substantially decreases the solubility of a binder resin in a developing liquid, owing to the interaction between the infrared absorbing agent and the binder resin. Meanwhile, in an exposed region (i.e., a non-image portion), the interaction between the infrared absorbing agent and the binder resin is suppressed by the heat generated in the exposed region, whereby the exposed region dissolves in an alkaline developing liquid and a planographic printing plate is formed.

However, in a planographic printing material which includes such an infrared ray-sensitive positive-working image forming material, a difference (i.e., discrimination; hereinafter, may be referred to as "solubility discrimination") between the strength of an image forming layer in an unexposed region and the solubility in an aqueous alkaline solution in an exposed region is not sufficiently obtained, and the development conditions (i.e., the development latitude) suitable for forming an image are restricted. Therefore, there have been concerns that a residual film is generated when development is performed using an exhausted developing liquid with low activity, or that an undesired decrease in the strength of an image portion occurs when development is performed using a developing liquid with high activity.

In order to solve the problem of development latitude, use of a recording layer which enables easier development of a non-image portion, that is, a recording layer which is formed from a material having a relatively higher solubility in an aqueous alkaline solution, might be considered. However, since such a recording layer also becomes chemically weak in the image region, there has been a problem in that durability during normal printing is poor and, further, the chemical resistance is poor; for example, the recording medium is susceptible to damage caused by a development solution, an ink cleaning solvent used during printing, a plate cleaner, or the like.

For the purpose of solving this problem, a method is proposed in which a multilayered recording layer is provided, and a lower layer having a high alkali solubility is provided in the vicinity of the recording layer, so that generation of a residual film after the upper layer has been removed by exposure is suppressed as a result of the high alkali solubility of the lower layer, whereby the development latitude is improved (see, for example, Japanese Patent Application Laid-Open (JP-A) No. 11-218914).

When a multilayered image recording layer is to be formed, the image recording layer is usually formed by sequentially applying a lower layer and an upper layer. Since the interface between an upper layer and a lower layer needs to be distinctly defined in order to benefit from the advantages of the multilayered structure, it is important to prevent the upper layer and the lower layer from being mixed during application of the upper layer.

An example of a method of preventing interface mixing caused by the compatibility between an upper layer and a lower layer generally includes a method in which the polarity of a lower layer is increased by introducing into the lower layer a binder polymer having a polar group such as a sulfonamide, thereby increasing the difference in polarity between the upper layer and the lower layer. However, there is a problem in that the development latitude becomes relatively narrower because the polar group included in a sulfonamide or the like that is capable of preventing the interlayer mixing between the lower layer and the upper layer, has a relatively high pKa. On the other hand, there is a problem in that an upper layer cannot be formed successfully when a binder polymer having a carboxylic acid group, which provides excellent development latitude, is used in a lower layer, because interlayer mixing between the lower layer and an upper layer is likely to occur due to polarity problems.

For the purpose of improving image formability, development latitude, solubility discrimination, and durability of an unexposed region while taking advantage of the characteristics of the multilayered structure, a technique is proposed in which a multifunctional amine compound is added to either of the layers of the multilayered structure, preferably to a lower layer, to allow interactions between plural functional groups and a binder polymer at multiple points, thereby improving the strength of an unexposed portion (see, for example, JP-A No. 2005-181734). However, even by using this method, the solubility of exposed portion cannot be sufficiently improved and, therefore, further improvement is desired.

SUMMARY OF THE INVENTION

According to an aspect of the present invention, an infrared-sensitive positive-working image forming material is provided in which each of development latitude, image formability and strength of the image portion are excellent, as well as in which a decrease in development properties is suppressed even after a long period of time has passed between pattern exposure and development treatment; an infrared-sensitive positive-working planographic printing plate precursor which has an infrared-sensitive positive-working image forming material and which has excellent image formability and excellent image portion printing durability; and a method for manufacturing a planographic printing plate using the planographic printing plate precursor.

The embodiments of the invention are described below.

<1> An image forming material including:

a support; and on the support, in this order, a lower layer and an upper layer whose solubility in an aqueous alkaline solution is increased by heat, the lower layer including a polymer, which has carboxylic acid groups at side chains thereof, and an infrared absorbing agent, at least a part of the carboxylic acid groups forming a salt structure with a monovalent basic compound.

<2> The image forming material according to <1>, wherein the monovalent basic compound is a nitrogen-containing basic compound.

<3> The image forming material according to <1>, wherein the monovalent basic compound is an onium hydroxide.

<4> The image forming material according to <3>, wherein the onium hydroxide is a compound having a structure represented by any one of the following Formulae (1) to (4):

(1)

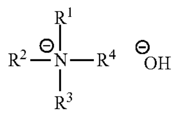

(2)

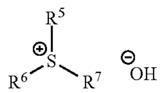

(3)

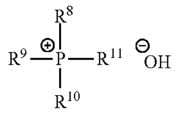

(4)

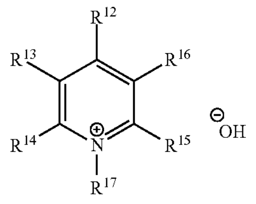

wherein, in Formulae (1) to (4), each of $R^1$ to $R^{17}$ independently represents a monovalent substituent; at least two of $R^1$ to $R^4$ may be bonded to each other to form a cyclic structure; at least two of $R^5$ to $R^7$ may be bonded to each other to form a cyclic structure; at least two of $R^8$ to $R^{11}$ may be bonded to each other to form a cyclic structure; and at least two of $R^{12}$ to $R^{17}$ may be bonded to each other to form a cyclic structure.

<5> The image forming material according to any one of claims <1> to <4>, wherein the polymer which has carboxylic acid groups at side chains thereof has a main chain structure selected from the group consisting of an acrylic resin, an acetal resin and a polyurethane.

<6> The image forming material according to <5>, wherein the acrylic resin is a copolymer containing a structural unit derived from a monomer selected from the group consisting of an N-substituted maleimide and a (meth)acrylamide.

<7> The image forming material according to any one of <1> to <5>, wherein the main chain structure of the polymer which has carboxylic acid groups at side chains thereof is a polyurethane.

<8> The image forming material according to any one of <1> to <7>, wherein the polymer which has carboxylic acid groups at side chains thereof is a polymer obtained by applying and drying a coating liquid composition comprising a polymer (A-1) having carboxylic acid groups and a monovalent basic compound (A-2).

<9> The image forming material according to <8>, wherein the carboxylic acid value of the polymer (A-1) having carboxylic acid groups is in the range from 0.01 mmol/g to 3.00 mmol/g.

<10> The image forming material according to any one of <1> to <9>, wherein the carboxylic acid value of the polymer which has carboxylic acid groups at side chains thereof is in the range from 0.001 mmol/g to 2.00 mmol/g.

<11> The image forming material according to any one of <1> to <10>, wherein the upper layer whose solubility in an aqueous alkaline solution is increased by heat comprises a water-insoluble and alkali-soluble resin.

<12> The image forming material according to any one of <1> to <10>, wherein the upper layer whose solubility in an aqueous alkaline solution is increased by heat further includes an infrared absorbing agent.

<13> An infrared sensitive positive-working planographic printing plate precursor, including the image forming material according to any one of <1> to <12>.

<14> A method for manufacturing a planographic printing plate, the method including, in the following order:

subjecting the infrared sensitive positive-working planographic printing plate precursor according to <13> to pattern exposure by an infrared ray; and developing the precursor using an aqueous alkaline solution having a pH of from 8.5 to 10.8.

<15> The method for manufacturing a planographic printing plate according to <14>, wherein the aqueous alkaline solution further includes an anionic surfactant or a nonionic surfactant.

According to the present invention, an infrared sensitive positive-working image forming material which has excellent image formability and excellent strength of the image portion, and in which a decrease in a development property is suppressed even after a long period of time has passed after a pattern exposure before a development treatment, is provided. Furthermore, a planographic printing plate precursor which is obtained by using the infrared sensitive positive-working image forming material, and which has an excellent "print stability" and excellent image formability and excellent image portion printing durability; and a method for manufacturing a planographic printing plate using the planographic printing plate precursor, are provided.

DETAILED DESCRIPTION OF THE INVENTION

The present invention is described in detail hereinbelow.

An image forming material of the present invention has at least a support and, on the support, a lower layer and an upper layer in this order, in which the lower layer includes a polymer in which at least a part of carboxylic acid groups thereof forms a salt structure with a monovalent basic compound. The mechanism of an excellent effect exerted by the characteristics is not clear, but estimated as follows.

By the investigation of the inventors of the present invention, it has been found that, generally, when a binder polymer having a carboxylic acid group is contained in a lower layer, solubility discrimination may not be attained owing to a low polarity, even though development latitude is favorable due to a low pKa. This is thought to be caused by compatibility of the lower layer with an upper layer thereof owing to the low polarity of the lower layer. In the present invention, on the other hand, because at least a part of carboxylic acid groups of a binder polymer form a salt structure with a monovalent basic compound, the polarity of the lower layer is increased remarkably and thus, the compatibility thereof with the upper layer at the interface is reduced, whereby solubility discrimination is attained. It is thought that, as a result thereof, both of image formability and strength of the image portion, which are characteristics of the multilayered structure, are achieved.

In other words, the polarity is improved by forming a salt structure using a carboxylic acid group and a monovalent basic compound, and further, the permeability of a developing agent is improved when the salt structure is formed in an exposed portion. For this reason, the inventors think that the permeability of a developing agent is improved, and the deterioration of development property over time does not occur even when the image forming material is stored until development after a pattern exposure.

Generally, when a salt structure is formed by a carboxylic acid group in a binder polymer and a basic compound, it is concerned that the durability (printing durability) is decreased. However, even in such a case, according to an embodiment of the present invention, by selectively using an acrylic resin, butyral resin or polyurethane having a strong aggregation property for the main chain structure of a binder polymer, the deterioration of durability (printing durability) is effectively suppressed, and the development latitude and image formability (solubility discrimination) are further improved.

The reason why "monovalent" basic compound exhibits an excellent effect is estimated as follows. That is, when a bi- or higher-valent compound forms a cross-linking structure with, for example, a carboxylic acid, the development property and the development latitude may tend to deteriorate. Such a cross-linking structure is not formed when a monovalent compound is used, and therefore, an excellent property is attained. In the present invention, from the viewpoint of suppressing compatibility between the upper layer and the lower layer, the pKa of conjugate acid of the basic compound is preferably 8 to 20, as described below. On the other hand, since a bi- or higher-valent basic compound more easily forms the cross-linking structure, it becomes further inevitable that the development property and the development latitude deteriorate. Thus, also from this viewpoint, use of a monovalent basic compound in the present invention is effective and preferred.

The term "forming a salt structure" as used herein not only means that a compound or a group as defined therein forms a salt as it is, but also means that a part of the compound or group is combined to form a salt. For example, an anion of a specific compound may be dissociated, and only a cation portion of the compound may form a salt with a $COO^-$ group. In this case, the residual group which is not contained in the above salt structure may or may not be contained in a specific layer. The above "salt structure" may exist in a layer of an image forming material in a dissociated manner.

Image Forming Material

An image forming material of the present invention includes sequentially a support, and, on the support, a lower layer containing a polymer which has carboxylic acid groups at side chains thereof, respectively, at least a part of the carboxylic acid groups forming a salt structure with a monovalent basic compound, and an infrared absorbing agent; and an upper layer whose solubility to an aqueous alkaline solution increases by heating, in this order.

The term "include sequentially" herein means that a lower layer and an upper layer are disposed on a support in this order. Other optional layers such as an undercoat layer or a surface protection layer may be further included. In the present invention, from the viewpoint of effectiveness, it is preferable that the lower layer and the upper layer are formed adjacent to each other.

In the following, the configuration of the image forming material of the present invention is described sequentially.

Lower Layer Containing Polymer which has Carboxylic Acid Groups at Side Chains and in which at Least a Part of Carboxylic Acid Groups Form Salt Structure with Monovalent Basic Compound and Infrared Absorbing Agent The lower layer in the invention contains at least: (A) a polymer which has carboxylic acid groups at side chains thereof, respectively, in which at least a part of the carboxylic acid groups is forming a salt structure with a monovalent basic compound; and (B) an infrared absorbing agent. The lower layer may further contain other additives as required as long as the effect of the invention is not impaired.

The binder polymer contained in the lower layer is not particularly limited, as long as it is a polymer having carboxylic acid groups, at least a part of the carboxylic acid groups forming a salt with a monovalent basic compound.

Examples of a method of forming a lower layer include a method including: preparing a coating liquid for foaming a lower layer (hereinbelow, may be referred to as "lower layer forming coating liquid") containing (A-1) a binder polymer having carboxylic acid groups, (A-2) a monovalent basic compound, and (B) an infrared absorbing agent; applying the coating liquid on a support or on an undercoated support; and drying the coated layer, in which a salt structure is formed between at least a part of the carboxylic acid groups of (A-1) the binder polymer and (A-2) the monovalent basic compound, in the process of forming a lower layer by applying and drying the lower layer forming coating liquid.

(A-1) Polymer Having Carboxylic Acid Groups (Binder Polymer)

In the present invention, a polymer having carboxylic acid groups, which is a binder polymer used in a lower layer of the invention, is not restricted as long as the polymer is a polymer having carboxylic acid groups in a molecule thereof.

The polymer may have a main chain of an acryl resin, a polyurethane, a polyvinyl alcohol, a polyacetal, a polyvinylformal, a polyamide, a polyester, an epoxy resin, or the like, and any of which may be used. In particular, a polyacetal or polyurethane is preferred from the viewpoints of image formability, printing durability and manufacturing suitability, and a polyurethane is most preferred from the viewpoints of printing durability and manufacturing suitability.

Polymers having a preferred main chain structure are described hereinbelow.

Polyurethane

In the present invention, a polyurethane which has carboxylic acid groups and is used for forming a lower layer is a polymer produced by a condensation reaction of a compound having two or more isocyanate groups and a compound having two or more hydroxyl groups, and not particularly restricted as long as the polyurethane is a polyurethane having at least one carboxylic acid in a molecule thereof. As the polyurethane having carboxylic acid groups, a polyurethane having a structure as described in JP-A No. 2003-177533, 2004-170525, 2004-239951, 2004-157459 or 2005-250158 is preferably used.

Hereinbelow, description will be given to a polyurethane, which is one of preferred embodiments of polyurethanes to be used in the invention, obtained by reacting a polyol component and a polyisocyanate, the polyol component being a polymer (a kind of macromonomer) obtained by a radical polymerization of an ethylenically unsaturated monomer under the presence of a mercaptane chain transfer agent having two or more hydroxyl groups and one mercapto group.

Examples of a method of manufacturing such a polyurethane resin include methods described in JP-A No. 04-178416, JP-A No. 04-178417, and the like.

Examples of ethylenically unsaturated monomer used for forming the polyol component include acrylic acid esters such as methyl acrylate, ethyl acrylate, propyl acrylate, butyl acrylate, amyl acrylate, ethyl hexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate or tetrahydroacrylate; aryl acrylates such as phenyl acrylate or furfuryl acrylate; methacrylic acid esters such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or tetrahydrofurfuryl methacrylate; aryl methacrylates such as phenyl methacrylate, cresyl methacrylate or naphthyl methacrylate;

acrylamides or derivatives thereof including N-alkylacrylamides such as N-methylacrylamide, N-ethylacrylamide, N-propylacrylamide, N-butylacrylamide, N-t-butylacrylamide, N-heptylacrylamide, N-octylacrylamide, N-cyclohexylacrylamide, or N-benzylacrylamide; N-arylacrylamides such as N-phenylacrylamide, N-tolylacrylamide, N-nitrophenylacrylamide, N-naphthylacrylamide, or N-hydroxyphenylacrylamide; N,N-dialkylacrylamides such as N,N-dimethylacrylamide, N,N-diethylacrylamide, N,N-dibutylacrylamide, N,N-dibutylacrylamide, N,N-diisobutylacrylamide, N,N-diethylhexylacrylamide, or N,N-dicyclohexylacrylamide; and N,N-arylacrylamides such as N-methyl-N-phenyl acrylamide, N-hydroxyethyl-N-methylacrylamide, or N-2-acetamidoethyl-N-acetylacrylamide;

methacrylamides or derivatives thereof including N-alkylmethacrylamides such as N-methylmethacrylamide, N-ethylmethacrylamide, N-propylmethacrylamide, N-butylmethacrylamide, N-t-butylmethacrylamide, N-ethylhexylmethacrylamide, N-hydroxyethylmethacrylamide or N-cyclohexylmethacrylamide; N-arylmethacrylamides such as N-phenylmethacrylamide or N-naphthylmethacrylamide; N,N-dialkylmethacrylamides such as N,N-diethylmethacrylamide, N,N-dipropylmethacrylamide or N,N-dibutylmethacrylamide; N,N-diarylmethacrylamides such as N,N-diphenylmethacrylamide; and methacrylamide derivatives such as N-hydroxyethyl-N-methylmethacrylamide, N-methyl-N-phenylmethacrylamide or N-ethyl-N-phenylmethacrylamide;

allyl compounds such as allyl acetate, allyl caproate, allyl caprylate, allyl laurate, allyl palmitate, allyl stearate, allyl benzoate, allyl acetoacetate, allyl lactate or allyloxyethanol; vinyl ethers such as hexyl vinyl ether, octyl vinyl ether, dodecyl vinyl ether, ethyl hexyl vinyl ether, methoxyethyl vinyl ether, ethoxyethyl vinyl ether, chloroethyl vinyl ether, 1-methyl-2,2-dimethyl propyl vinyl ether, 2-ethyl butyl vinyl ether, hydroxyethyl vinyl ether, diethylene glycol vinyl ether, dimethyl aminoethyl vinyl ether, diethyl aminoethyl vinyl ether, butyl aminoethyl vinyl ether, benzyl vinyl ether, tetrahydrofurfuryl vinyl ether, vinyl phenyl ether, vinyl tolyl ether, vinyl chlorophenyl ether, vinyl-2,4-dichlorophenyl ether, vinyl naphthyl ether or vinyl anthranyl ether; vinyl esters such as vinyl butyrate, vinyl isobutyrate, vinyl trimethyl acetate, vinyl diethyl acetate, vinyl valerate, vinyl caproate, vinyl chloroacetate, vinyl methoxyacetate, vinyl butoxyacetate, vinyl phenyl acetate, vinyl acetoacetate, vinyl lactate, vinyl-β-phenyl butyrate, vinyl cyclohexyl carboxylate, vinyl benzoate, vinyl salicylate, vinyl chlorobenzoate, vinyl tetrachlorobenzoate or vinyl naphthoate;

styrenes such as methyl styrene, dimethyl styrene, trimethyl styrene, ethyl styrene, diethyl styrene, isopropyl styrene, butyl styrene, hexyl styrene, cyclohexyl styrene, dodecyl styrene, benzyl styrene, chloromethyl styrene, trifluoromethyl styrene, ethoxymethyl styrene, acetoxymethyl styrene, methoxystyrene, 4-methoxy-3-methyl styrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethyl styrene or 4-fluoro-3-trifluoromethyl styrene; crotonic acid esters such as butyl crotonate, hexyl crotonate, crotonic acid or glycerol monocrotonate; dialkyl itaconates such as dimethyl itaconate, diethyl itaconate or dibutyl itaconate; dialkyls of maleic acid or fumaric acid such as dimethyl malate or dibutyl fumarate; maleimides such as maleimide, N-phenylmaleimide, N-2-methylphenylmaleimide, N-2,6-diethylphenylmaleimide, N-2-chlorophenylmaleimide, N-cyclohexylmaleimide, N-laurylmaleimide or N-hydroxyphenylmaleimide; and N-vinylpyrrolidone, N-vinylpyridine, acrylonitrile, and methacrylonitrile.

Specific examples [Exemplary compounds (MM-1) to (MM-24)] of macromonomer which is a polyol component suitable as a source of polyurethane used in the invention are exemplified by listing the chain transfer agents, source monomers used for manufacturing the polyurethane and the addition amount (mol %) and molecular weight thereof, but the present invention is not limited thereto.

| | Chain Transfer Agent | | Monomer 1 | |
|---|---|---|---|---|
| | Structure | Amount (mol %) | Structure | Amount (mol %) |
| MM-1 | 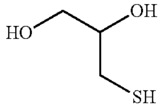 | 20 | — | 0 |
| MM-2 | 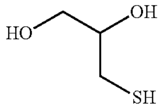 | 20 | — | 0 |

-continued
| | | | | |
|---|---|---|---|---|
| MM-3 | 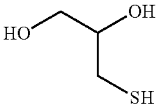 | 20 | — | 0 |
| MM-4 | 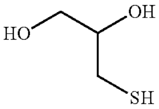 | 20 | 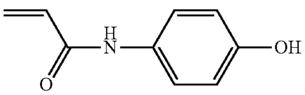 | 80 |
| MM-5 | 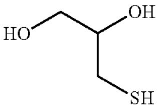 | 20 | 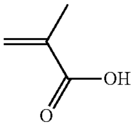 | 80 |
| MM-6 | 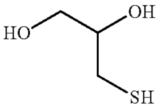 | 20 | 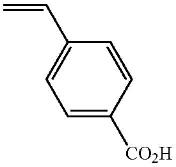 | 80 |
| MM-7 | 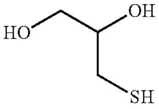 | 20 | 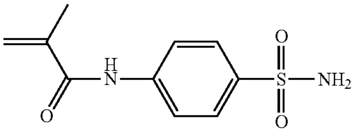 [SMILES: C=C(C)C(=O)Nc1ccc(S(N)(=O)=O)cc1] | 80 |
| MM-8 | 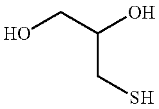 | 11 | 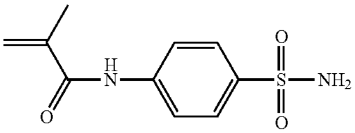 | 89 |
| MM-9 | 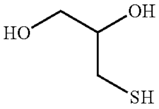 | 8 | 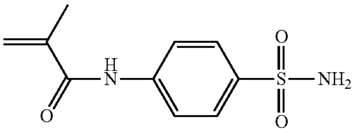 [SMILES: C=C(C)C(=O)Nc1ccc(S(N)(=O)=O)cc1] | 92 |
| MM-10 | 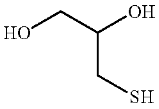 | 5 | 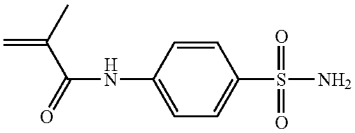 | 95 |
| MM-11 | 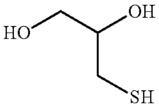 | 20 | 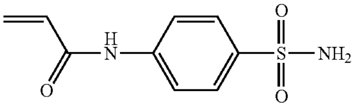 | 80 |
| MM-12 | 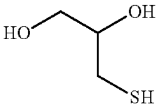 | 20 | 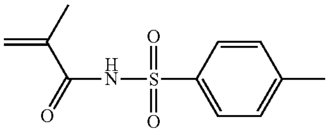 [SMILES: C=C(C)C(=O)NS(=O)(=O)c1ccc(C)cc1] | 80 |
| MM-13 | 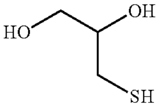 | 20 | 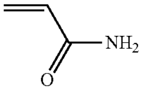 | 80 |

-continued
| | | | | |
|---|---|---|---|---|
| MM-14 | 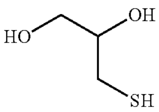 | 20 | 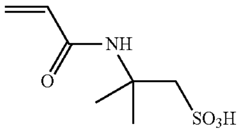 | 80 |
| MM-15 | 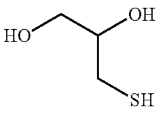 | 20 | 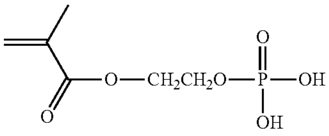 | 80 |
| MM-16 | 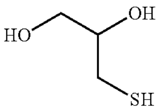 | 20 | 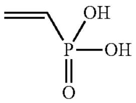 | 80 |
| MM-17 | 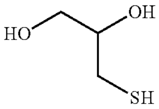 | 20 | 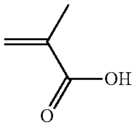 | 40 |
| MM-18 | 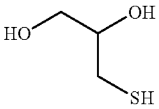 | 20 | 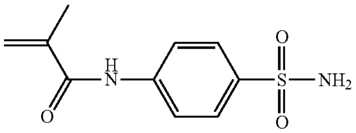 | 40 |
| MM-19 | 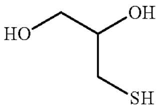 | 20 | 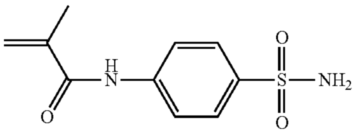 [SMILES: C=C(C)C(=O)Nc1ccc(S(N)(=O)=O)cc1] | 40 |
| MM-20 | 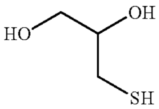 | 20 | 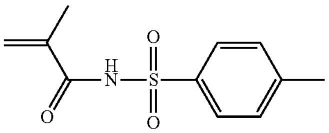 [SMILES: C=C(C)C(=O)NS(=O)(=O)c1ccc(C)cc1] | 40 |
| MM-21 | 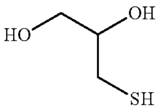 | 20 | 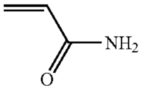 | 40 |
| MM-22 | 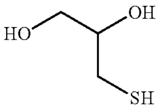 | 20 | 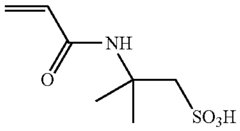 | 40 |
| MM-23 | 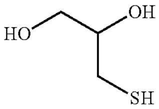 | 20 | 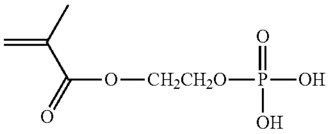 | 40 |
| MM-24 | 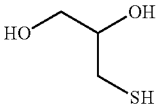 | 20 | 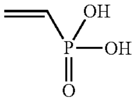 | 40 |

-continued
| | Monomer 2 | | Monomer 3 | |
|---|---|---|---|---|
| | Structure | Amount (mol %) | Structure | Amount (mol %) |
| MM-1 | 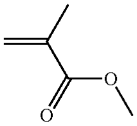 | 80 | — | 0 |
| MM-2 | 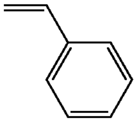 | 80 | — | 0 |
| MM-3 | 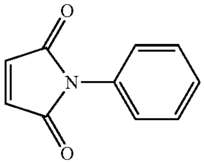 [SMILES: O=C1C=CC(=O)N1c1ccccc1] | 50 | 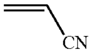 | 30 |
| MM-4 | — | 0 | — | 0 |
| MM-5 | — | 0 | — | 0 |
| MM-6 | — | 0 | — | 0 |
| MM-7 | — | 0 | — | 0 |
| MM-8 | — | 0 | — | 0 |
| MM-9 | — | 0 | — | 0 |
| MM-10 | — | 0 | — | 0 |
| MM-11 | — | 0 | — | 0 |
| MM-12 | — | 0 | — | 0 |
| MM-13 | — | 0 | — | 0 |
| MM-14 | — | 0 | — | 0 |
| MM-15 | — | 0 | — | 0 |
| MM-16 | — | 0 | — | 0 |
| MM-17 | 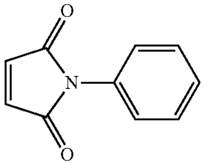 [SMILES: O=C1C=CC(=O)N1c1ccccc1] | 20 | 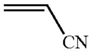 | 20 |
| MM-18 | 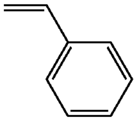 | 40 | — | 0 |
| MM-19 | 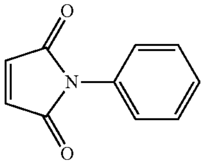 [SMILES: O=C1C=CC(=O)N1c1ccccc1] | 20 | 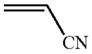 | 20 |
| MM-20 | 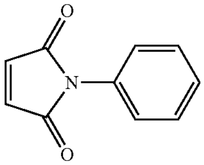 [SMILES: O=C1C=CC(=O)N1c1ccccc1] | 20 | 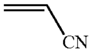 | 20 |

-continued

| | | | | |
|---|---|---|---|---|
| MM-21 | 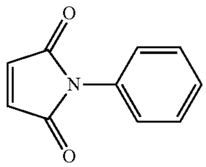 [SMILES: O=C1C=CC(=O)N1c1ccccc1] | 20 | 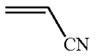 | 20 |
| MM-22 | 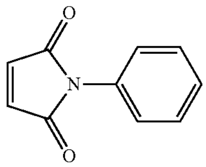 [SMILES: O=C1C=CC(=O)N1c1ccccc1] | 20 | 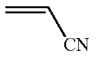 | 20 |
| MM-23 | 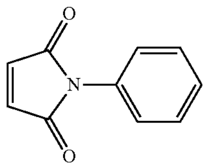 [SMILES: O=C1C=CC(=O)N1c1ccccc1] | 20 | 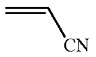 | 20 |
| MM-24 | 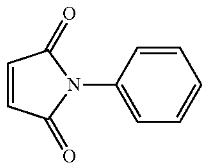 [SMILES: O=C1C=CC(=O)N1c1ccccc1] | 20 | 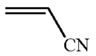 | 20 |

Meanwhile, the ethylenically unsaturated monomer may preferably be any one of ethylenically unsaturated monomers having groups with an inorganic value of 200 or higher described in "New Edition, Organic Chemistry Concept Diagram, Basics and Applications" co-authored by Yoshio Kohda, Shirou Satou and Yoshio Honma, from the viewpoints of development property, image formability (solubility discrimination) and UV printing durability.

Examples of a group having an inorganic value of 200 or higher include $-SO_2-NH-CO-$, $-N{=}N-NH_2$, $-SO_3H$, $-NH-SO_2-NH-$, $-CO-NH-CO-NH-CO-$, $-CO-NH-CO-NH-$, $-SO_2NH-$, $-CS-NH-$, $-CO-NH-CO-$, $=N-OH$, $-NH-CO-NH-$, $=N-NH-$, $-CO-NH-NH_2$ or $-CO-NH-$. Among these groups, acid groups are more preferred. In particular, from the viewpoints of printing durability and manufacturing suitability, groups having a sulfonamide group are most preferred. Such ethylenically unsaturated monomers may be used alone, or a combination of two or more thereof may be used. Further, the polymer (hereinafter, also referred to as "macromonomer") may further contain an ethylenically unsaturated group other than the above-mentioned preferable ethylenically unsaturated monomers.

As preferred examples of polyurethanes which may be used in the present invention, polymers PU-1 to PU-42 are shown below with source monomers thereof, the employed molar ratios and the weight-average molecular weights (Mw) of the obtained specific polyurethanes, but the polyurethane resin to be used in the invention is not limited thereto. In the following Table, the numerals that are described below the names of the monomers represent molar ratios of the monomers to be used, respectively, and "PU-1" to "PU-42" mean specific polyurethanes as reaction products of the monomers described in Tables 1 and 2 (see Examples section of the present specification).

The weight-average molecular weight (Mw) of a polymer is a value measured by Gel Permeation Chromatography (GPC).

| | Diisocyanate compound (molar ratio) | | Diol compound (molar ratio) | | Mw |
|---|---|---|---|---|---|
| PU-1 | MDI<br>40 | TDI<br>10 | DMPA<br>50 | | 50,000 |
| PU-2 | MDI<br>40 | PPDI<br>10 | DMPA<br>50 | | 63,000 |
| PU-3 | MDI<br>40 | HDI<br>10 | DMPA<br>50 | | 62,000 |
| PU-4 | MDI<br>40 | TMHDI<br>10 | DMPA<br>50 | | 60,000 |
| PU-5 | MDI<br>40 | H12MDI<br>10 | DMPA<br>50 | | 49,000 |
| PU-6 | MDI<br>40 | IPDI<br>10 | DMPA<br>50 | | 55,000 |
| PU-7 | MDI<br>40 | TMXDI<br>10 | DMPA<br>50 | | 54,000 |
| PU-8 | MDI<br>40 | XDI<br>10 | DMPA<br>50 | | 59,000 |
| PU-9 | MDI<br>40 | H6HDI<br>10 | DMPA<br>50 | | 57,000 |
| PU-10 | MDI<br>40 | NDI<br>10 | DMPA<br>50 | | 56,000 |
| PU-11 | MDI<br>40 | TDI<br>10 | DMPA<br>40 | TEG<br>10 | 52,000 |
| PU-12 | MDI<br>40 | TDI<br>10 | DMPA<br>40 | DPA<br>10 | 53,000 |
| PU-13 | MDI<br>40 | TDI<br>10 | DMPA<br>40 | MDSA<br>10 | 49,000 |
| PU-14 | MDI<br>40 | TDI<br>10 | DMPA<br>40 | pTHF-1000<br>10 | 60,000 |
| PU-15 | MDI<br>40 | TDI<br>10 | DMPA<br>40 | PPG-1000<br>10 | 61,000 |
| PU-16 | MDI<br>40 | TDI<br>10 | DMPA<br>40 | pED-1000<br>10 | 58,000 |

-continued

| | Diisocyanate compound (molar ratio) | | Diol compound (molar ratio) | | Mw |
|---|---|---|---|---|---|
| PU-17 | MDI 40 | TDI 10 | DMPA 40 | pCD-1000 10 | 50,000 |
| PU-18 | MDI 40 | TDI 10 | DMPA 40 | DD 10 | 52,000 |
| PU-19 | MDI 40 | TDI 10 | DMPA 45 | MM-1 5 | 55,000 |
| PU-20 | MDI 40 | TDI 10 | DMPA 45 | MM-2 5 | 49,000 |
| PU-21 | MDI 40 | TDI 10 | DMPA 45 | MM-3 5 | 50,000 |
| PU-22 | MDI 40 | TDI 10 | DMPA 45 | MM-4 5 | 53,000 |
| PU-23 | MDI 40 | TDI 10 | DMPA 45 | MM-5 5 | 60,000 |
| PU-24 | MDI 40 | TDI 10 | DMPA 45 | MM-6 5 | 55,000 |
| PU-25 | MDI 40 | TDI 10 | DMPA 45 | MM-7 5 | 54,000 |
| PU-26 | MDI 40 | TDI 10 | DMPA 47.7 | MM-8 2.3 | 50,000 |
| PU-27 | MDI 40 | TDI 10 | DMPA 48.8 | MM-9 1.2 | 53,000 |
| PU-28 | MDI 40 | TDI 10 | DMPA 49 | MM-10 1 | 56,000 |
| PU-29 | MDI 40 | TDI 10 | DMPA 45 | MM-11 5 | 51,000 |
| PU-30 | MDI 40 | TDI 10 | DMPA 45 | MM-12 5 | 48,000 |
| PU-31 | MDI 40 | TDI 10 | DMPA 45 | MM-13 5 | 54,000 |
| PU-32 | MDI 40 | TDI 10 | DMPA 45 | MM-14 5 | 55,000 |
| PU-33 | MDI 40 | TDI 10 | DMPA 45 | MM-15 5 | 59,000 |
| PU-34 | MDI 40 | TDI 10 | DMPA 45 | MM-16 5 | 60,000 |
| PU-35 | MDI 40 | TDI 10 | DMPA 45 | MM-17 5 | 62,000 |
| PU-36 | MDI 40 | TDI 10 | DMPA 45 | MM-18 5 | 54,000 |
| PU-37 | MDI 40 | TDI 10 | DMPA 45 | MM-19 5 | 53,000 |
| PU-38 | MDI 40 | TDI 10 | DMPA 45 | MM-20 5 | 52,000 |
| PU-39 | MDI 40 | TDI 10 | DMPA 40 | MM-21 30 | 54,000 |
| PU-40 | MDI 40 | TDI 10 | DMPA 45 | MM-22 5 | 56,000 |
| PU-41 | MDI 40 | TDI 10 | DMPA 45 | MM-23 5 | 57,000 |
| PU-42 | MDI 40 | TDI 10 | DMPA 45 | MM-24 5 | 60,000 |

The details of source monomers (i.e., isocyanates and polyols) used in the above Tables are shown below. The polyol component represented by "MM-X" (for example, "MM-1" used as a diol compound for forming a polymer PU-19) is a macromonomer exemplified above.

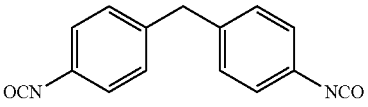

MDI

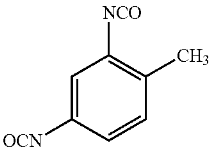

TDI

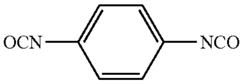

PPDI

-continued

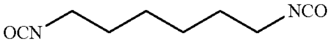

HDI

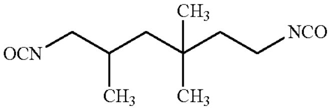

TMHDI

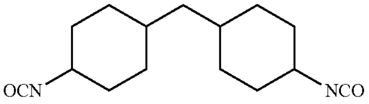

H12MDI

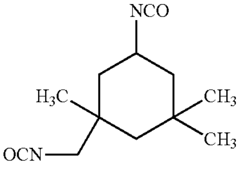

IPDI

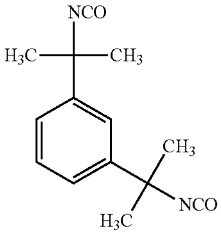

TMXDI

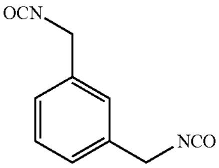

XDI

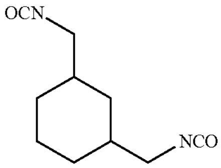

H6 XDI

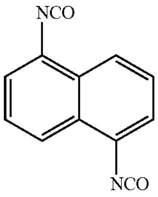

NDI

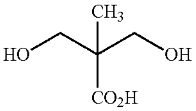

DMPA

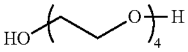

TEG

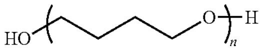

Mn = 1,000
pTHF-1000

$HO-(CH_2)_4-OH$ BD $HO-(CH_2)_6-OH$ HD $HO-(CH_2)_{10}-OH$ DD

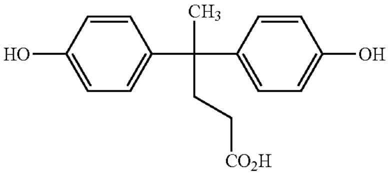

DPA

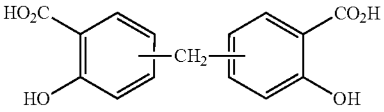

MDSA

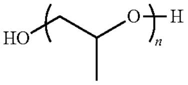

Mn = 1,000
PPG-1000

-continued

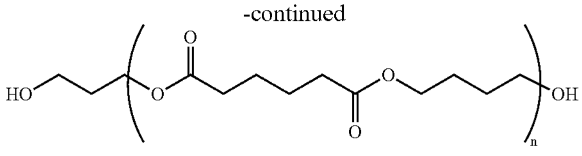

Mn = 1,000
pED-1000

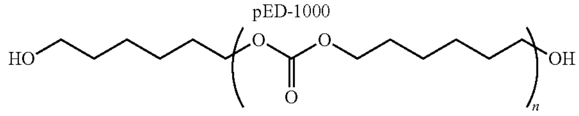

Mn = 1,000
pCD-1000

Among these, polymers PU-1, PU-25, PU-26, PU-27, and PU-28 are exemplified as preferred polyurethanes.

Polyacetal

In the present invention, a polyacetal which may be used for a main chain of a polymer containing carboxylic acid groups refers to a polymer synthesized by reacting (acetalization reaction) a polyvinyl alcohol obtained by saponification of a part of or a whole of polyvinyl acetate with an aldehyde compound under an acid condition. Further, the polyacetal may be a polymer in which a carboxylic acid or the like is introduced by a method in which a compound containing the residual hydroxyl group and an acid anhydride and the like is reacted. A more preferred example of the polyacetal is a polyvinyl butyral resin which has a carboxylic acid group introduced thereto and is represented by the following Formula (II).

Formula (II)

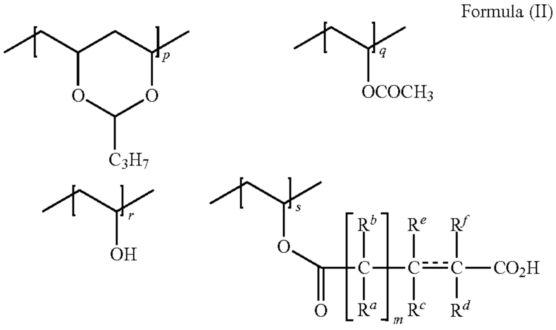

In Formula (II), a preferred ratio of repeating units is in the following range: p/q/r/s=50-78 mol %/1-5 mol %/5-28 mol %/5-20 mol %.

In Formula (II), $R^a$, $R^b$, $R^c$, $R^d$, $R^e$ and $R^f$ each independently represent a hydrogen atom, a monovalent substituent which may have a substituent, or a single bond, and m represents an integer of 0 to 1.

Preferred examples of $R^a$, $R^b$, $R^c$, $R^d$, $R^e$ and $R^f$ include a hydrogen atom, an alkyl group which may have a substituent, a halogen atom, and an aryl group which may have a substituent. Further preferred examples of $R^a$, $R^b$, $R^c$, $R^d$, $R^e$ and $R^f$ include a hydrogen atom, a linear alkyl group such as a methyl group, an ethyl group or a propyl group, an alkyl group in which a carboxylic acid is substituted, a halogen atom, a phenyl group, and a phenyl group in which a carboxylic acid is substituted.

$R^c$ and $R^d$ may be bonded to each other to form a cyclic structure, and $R^e$ and $R^f$ may be bonded to each other to form a cyclic structure.

A bond between the carbon atom to which $R^c$ and $R^e$ are bound and the carbon atom to which $R^d$ and $R^f$ are bound may be a single bond, a double bond or an aromatic-double bond. When the bond is a double bond or an aromatic-double bond, $R^c$ and $R^d$, $R^e$ and $R^f$, $R^c$ and $R^f$, or $R^e$ and $R^d$ may be bonded to each other to form a single bond. Preferred examples of the carboxylic acid group-containing unit include the following units.

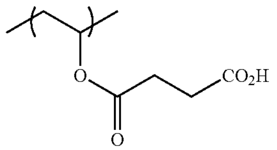

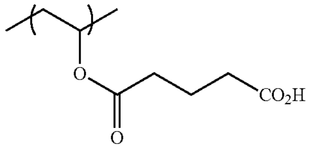

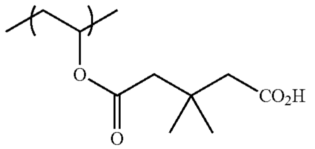

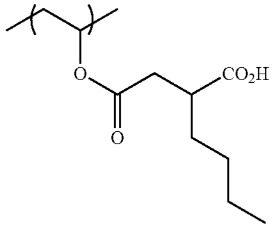

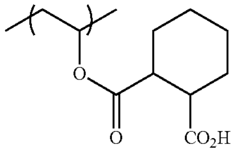

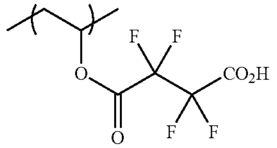

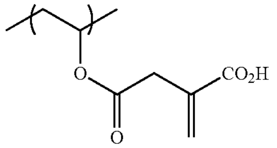

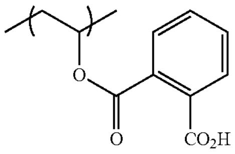

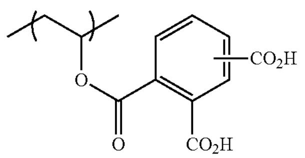

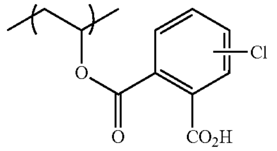

Preferred examples of polyacetal having carboxylic acid groups at side chains thereof, respectively, used in the present invention are shown below, but the present invention is not limited thereto.

(PB-1)

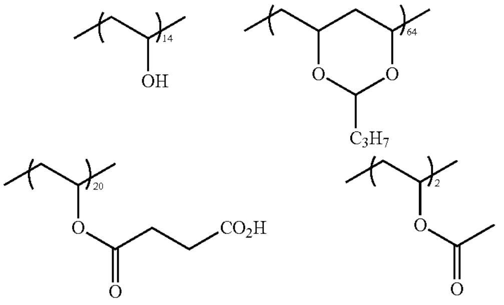

Mw = 76,000

(PB-2)

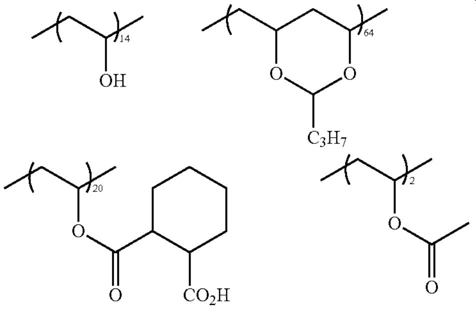

Mw = 77,000

(PB-3)

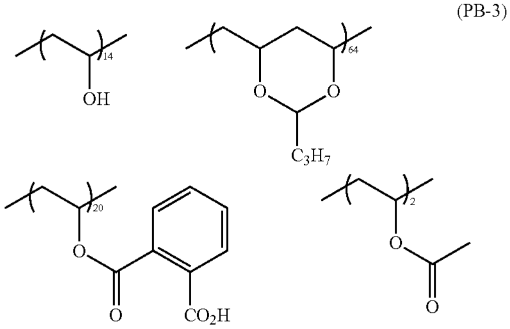

Mw = 72,000

(PB-4)

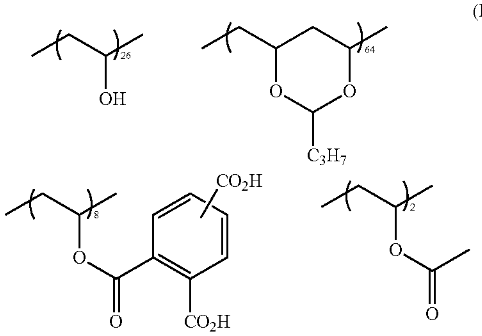

Mw = 69,000

Among these, polymer (PB-4) or the like is preferred as the polyacetal.

Examples of a polymer having carboxylic acid groups preferably used in the present invention other than the above-mentioned polymer having a preferable main chain structure include a polymer whose main chain structure is an acrylic resin.

Herein, regarding the notation of a group (including an atomic group), the notation without "substituted" or "unsubstituted" includes both a group with a substituent and a group without a substituent. For example, an "alkyl group" includes not only an alkyl group having no substituent (unsubstituted alkyl group) but also an alkyl group having a substituent (substituted alkyl group).

Acrylic Resin

In the present invention, an "acrylic resin" refers to a copolymer which has, as polymerization components, (meth) acrylic acid, a (meth)acrylic acid ester (e.g., an alkyl ester, aryl ester or allyl ester), (meth)acrylamide, and a derivative of (meth)acrylic acid such as a (meth)acrylamide derivative.

A monomer unit containing a carboxylic acid group is not particularly limited, but may preferably a monomer structure described in JP-A No. 2002-40652 or in paragraphs [0059] to [0075] of JP-A No. 2005-300650. In particular, an acrylic resin containing, as a copolymer component, a structural unit derived from a monomer selected from the group consisting of an N-substituted maleimide and a (meth)acrylamide which may have a substituent is preferred.

As a monomer unit derived from a (meth)acrylamide, a monomer unit derived from a (meth)acrylic acid amide described in paragraphs [0061] to [0084] of JP-A No. 2007-272134 is preferably used. Furthermore, a copolymer containing, as monomer units, an N-phenylmaleimide and methacrylamide described in U.S. Pat. No. 6,358,669 may be preferably used.

Herein, "(meth)acryl" refers to either or both of "acryl" and "methacryl".

Specific examples [exemplary compounds (PA-1) to (PA-10)] of "acrylic resin" used in the present invention are shown below, with structural units, contents (mol %) of structural units and weight-average molecular weights (Mw) thereof, but the present invention is not limited thereto.

The weight-average molecular weight of a polymer is a value measured by GPC.

(PA-1)

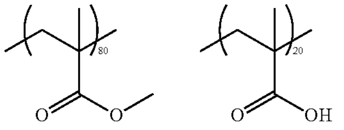

Mw = 46,000

(PA-2)

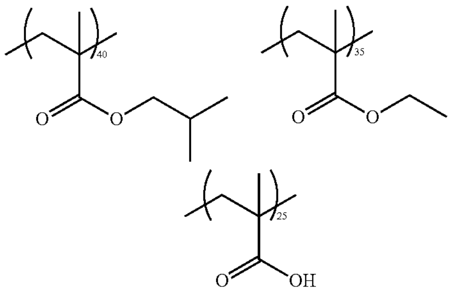

Mw = 48,000

(PA-3)

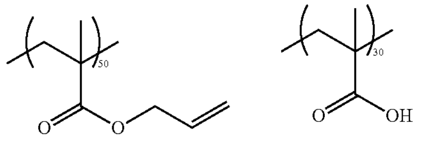

-continued

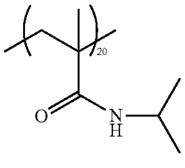

Mw = 52,000

(PA-4)

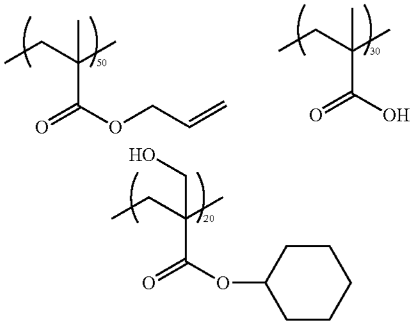

Mw = 51,000

(PA-5)

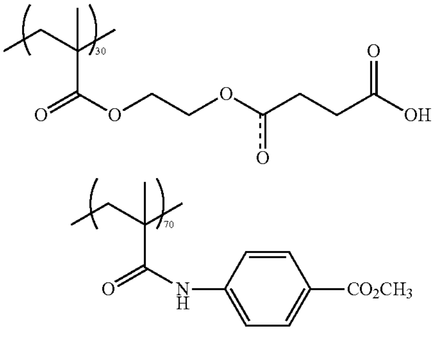

Mw = 50,000

(PA-6)

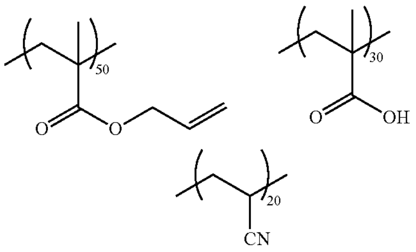

Mw = 48,000

(PA-7)

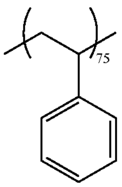

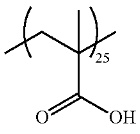

Mw = 47,000

(PA-8)

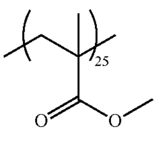

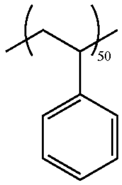

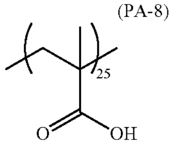

Mw = 50,000

-continued (PA-9)

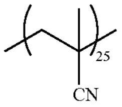

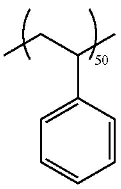

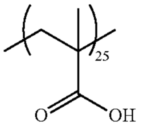

Mw = 50,000

(PA-10)

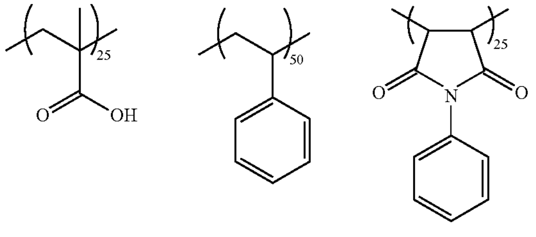

Mw = 50,000

The acrylic resin is preferably an acrylic resin whose carboxylic acid value in a state prior to the formation of a salt structure with a monovalent basic compound is in the range from 0.01 mmol/g to 3.00 mmol/g.

Among the above-mentioned exemplary compounds, exemplary compounds (PA-3), (PA-5), (PA-10) and the like are particularly preferred.

The molecular weight (weight-average molecular weight) of a polymer having carboxylic acid groups used for forming a lower layer of the present invention is, from the viewpoints of the development property and printing durability, preferably from 5,000 to 500,000, more preferably from 10,000 to 200,000 and most preferably from 15,000 to 100,000.

The content of carboxylic acid group in a polymer having carboxylic acid groups is, from the viewpoint of the balance between development property and printing durability, such that the carboxylic acid value of (A-1) a binder polymer is in the range of from 0.01 mmol/g to 3.00 mmol/g, and more preferably in the range of from 0.05 mmol/g to 2.60 mmol/g.

A content of binder polymer having carboxylic acid groups is preferably from 50 to 98% by weight with respect to the total solid content in a lower layer of the present invention. When the content of an alkali soluble resin to be added is 50% by weight or more, a recording layer (i.e., photosensitive layer) is excellent in durability, and when the content of an alkali soluble resin to be added is 98% by weight or less, both of the sensitivity and the durability are excellent.

As used herein, "solid content" refers to the total amount of the ingredients included an infrared sensitive positive-working composition for forming an upper layer, except solvent(s).

(A-2) Monovalent Basic Compound

The monovalent basic compound to be used in a lower layer in the present invention refers to an monovalent basic compound capable of forming a salt structure with a carboxylic acid in the above-mentioned polymer having carboxylic acid groups. Preferred examples thereof include a hydroxide or oxide of an alkaline metal, a hydrogen carbonate, an alkoxide (ROM), a phenoxide (ArONa) or the like, ammonia (gas or aqueous solution), amines other than diarylamines and triarylamines (because diarylamines and triarylamines are almost neutral and have an insufficient salt formability with a carboxylic acid group), heterocyclic bases such as pyridine, quinoline, or piperidine, hydrazine derivatives, amidine derivatives, and onium hydroxides. The pKa of a conjugate acid of the monovalent basic compound to be used is preferably from 8 to 20, more preferably from 10 to 18, and most preferably from 11 to 17. When the pKa of a conjugate acid is less than 8, it is concerned that the solubility discrimination decreases, and when the pKa of a conjugate acid is larger than 20, the stability and manufacturing suitability of the compound may deteriorate. Unless otherwise specified, "pKa" herein refers to a value measured at a temperature of 25° C. The exemplary compounds described below each have a pKa in the range of from 8 to 20.

Among the monovalent basic compounds which may be used in the present invention, a hydroxide or oxide of an alkali metal, a hydrogen carbonate, an alkoxide (ROM), a phenoxide (ArONa), ammonia (gas or aqueous solution), and nitrogen-containing basic compounds are preferred, and nitrogen-containing basic compounds shown below, that is, nitrogen-containing basic compounds having a structure represented by the following Formulae (A) to (E), respectively, are preferred.

(A)

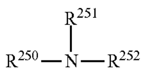

In Formula (A), $R^{250}$, $R^{251}$ and $R^{252}$ each independently represent a hydrogen atom, an alkyl group having 1 to 20 carbon atoms or an aryl group having 6 to 20 carbon atoms, and $R^{251}$ and $R^{252}$ may be bonded to each other to form a ring. The alkyl group or the aryl group may further have a substituent such as a hydroxyl group, an amide group or an ester group.

(B)

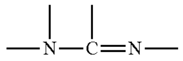

(C)

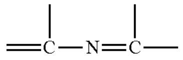

(D)

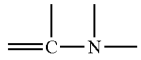

(E)

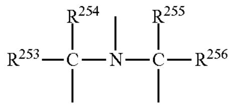

In Formula (E), $R^{253}$, $R^{254}$, $R^{255}$ and $R^{256}$ independently represent an alkyl group having 1 to 20 carbon atoms.

Specific examples of a monovalent basic compound which may be used in the present invention and has a chemical structure represented by any one of Formulae (A) to (E) are shown below, but the present invention is not limited thereto.

(B-1)

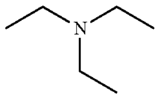

-continued (B-2)

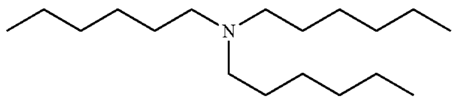

(B-3)

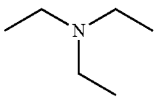

(B-4)

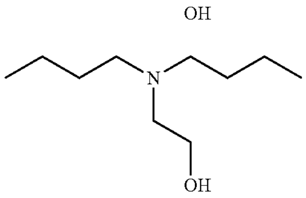

(B-5)

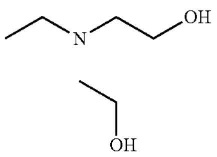

(B-6)

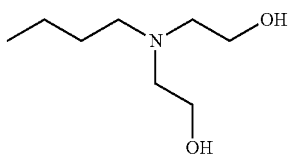

(B-7)

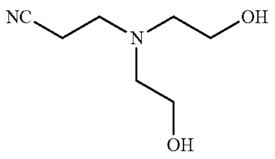

(B-8)

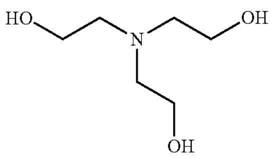

(B-9)

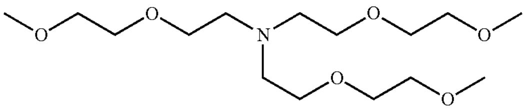

(B-10)

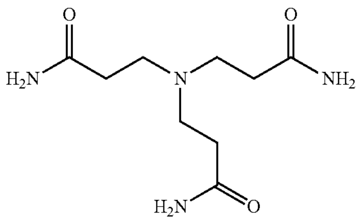

(B-11)

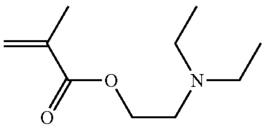

-continued
(B-12)
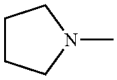
(B-13)
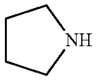
(B-14)
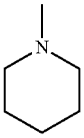
(B-15)
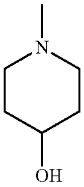
(B-16)
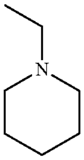
(B-17)
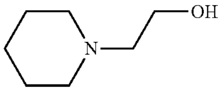
(B-18)
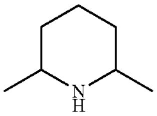
(B-19)
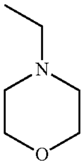
(B-20)
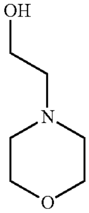
(B-21)
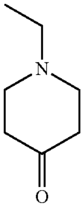
-continued
(B-22)
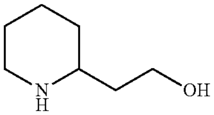
(B-23)
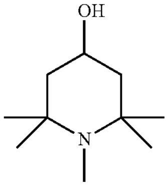
(B-24)
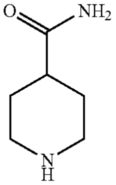
(B-25)
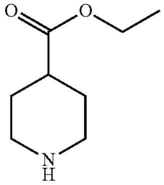
(B-28)
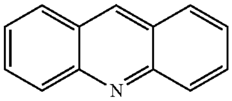
(B-29)
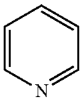
(B-30)
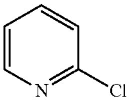
(B-31)
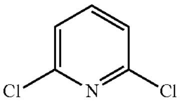
(B-32)
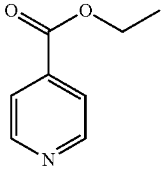
(B-33)
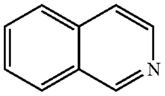
(B-34)
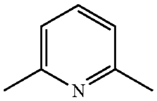

-continued (B-35)

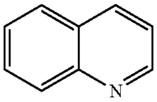

(B-36)

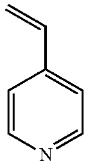

(B-37)

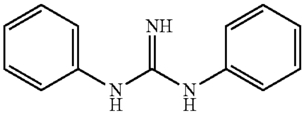

(B-38)

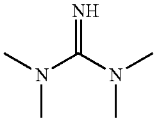

(B-39)

$CH_3ONa$ (B-40)

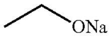

(B-41)

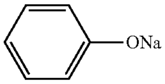

(B-42)

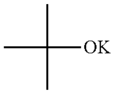

(B-43)

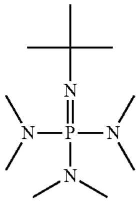

(B-44)

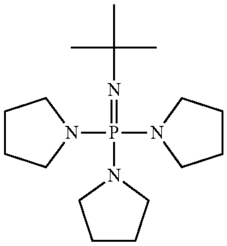

More preferred compounds are nitrogen-containing cyclic compounds or nitrogen-containing basic compounds having, in a molecule thereof, two or more nitrogen atoms which are in different chemical environments. More preferably, the nitrogen-containing cyclic compound has a polycyclic structure. Preferred specific examples of the nitrogen-containing polycyclic compound include a compound represented by the following Formula (F).

(F)

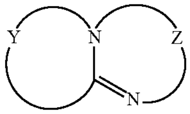

In Formula (F), Y and Z independently may contain a hetero atom and may independently represent a linear, branched or cyclic alkylene group. Here, examples of the hetero atom include a nitrogen atom, a sulfur atom and an oxygen atom. The alkylene group is preferably an alkylene group having 2 to 10 carbon atoms, and more preferably an alkylene group having 2 to 5 carbon atoms.

When the alkylene group has a substituent, examples of the substituent include an alkyl group having 1 to 6 carbon atoms, an aryl group, and alkenyl group, as well as a halogen atom and a halogen-substituted alkyl group.

Specific examples of basic compound represented by Formula (F) include the compounds shown below.

(B-45)

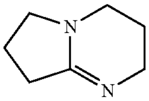

(B-46)

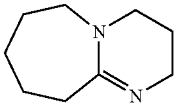

(B-47)

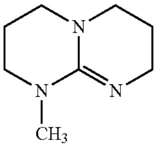

(B-48)

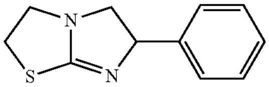

(B-49)

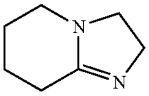

(B-50)

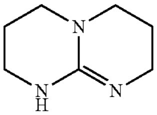

(B-51)

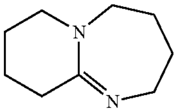

(B-52)

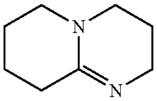

Among the monovalent basic compounds, 1,8-diazabicyclo[5.4.0]undec-7-ene and 1,5-diazabicyclo[4.3.0]non-5-ene are particularly preferred.

As the nitrogen-containing basic compound having, in a molecule thereof, two or more nitrogen atoms which are in different chemical environments, a compound containing both a substituted or unsubstituted amino group and a cyclic structure containing a nitrogen atom, or a compound having an alkyl amino group is particularly preferred. Examples of particularly preferred compounds include guanidine, 1,1-dimethylguanidine, 1,1,3,3-tetramethylguanidine, pyrazole, pyrazine, pyrimidine, 6-dihydroxypyrimidine, 2-pyrazoline, 3-pyrazoline, trimethylimidazole, triphenylimidazole and methyldiphenylimidazole, but are not limited thereto.

An onium hydroxide is also a preferred example of the monovalent basic compound. Specific examples of onium include a substituted or unsubstituted ammonium, a substituted or unsubstituted sulfonium salt, a substituted or unsubstituted phosphonium salt, and a substituted or unsubstituted pyridinium salt.

Further preferred examples of onium hydroxide include those having structures represented by the following Formulae (1) to (4).

Formula (1)

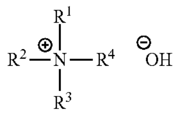

Formula (2)

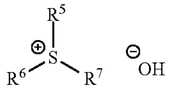

Formula (3)

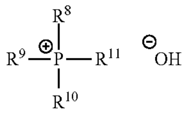

Formula (4)

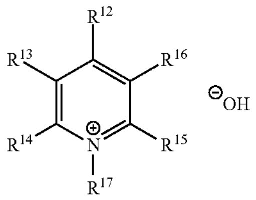

In Formulae (1) to (4), $R^1$ to $R^{17}$ each independently represent a monovalent substituent, and at least two of $R^1$ to $R^4$, at least two of $R^5$ to $R^7$, at least two of $R^8$ to $R^{11}$, or at least two of $R^{12}$ to $R^{17}$ may be bonded to each other to form a cyclic structure.

Examples of monovalent substituent represented by any one of $R^1$ to $R^{17}$ include a substituted or unsubstituted alkyl group, a substituted or unsubstituted alicyclic group, a substituted or unsubstituted heterocyclic group (including a heteroaryl group), a substituted or unsubstituted aryl group, a substituted or unsubstituted aralkyl group, an alkyl group having 1 to 10 carbon atoms, an aryl group having 6 to 20 carbon atoms, and a substituted or unsubstituted aralkyl group having 6 to 20 carbon atoms. Particularly preferred examples thereof are those having a structure represented by the following Formula (5) or (6).

Formula (6)

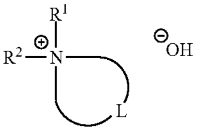

Formula (5)

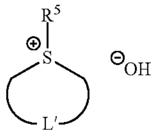

In Formulae (6) and (5), $R^1$, $R^2$ and $R^5$ have the same definitions as $R^1$, $R^2$ and $R^5$ in Formulae (1) to (4), respectively, and the preferred ranges thereof are also the same. L and L' in Formula (6) and (5) each independently represent an atomic group necessary for forming a hetero ring. The hetero cycle is preferably 5-membered or 6-membered.

Specific exemplary compounds of preferred onium hydroxide are shown below, but not limited thereto.

(O-1)

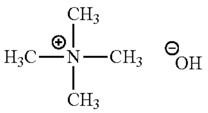

(O-2)

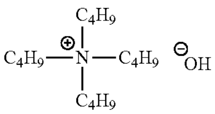

(O-3)

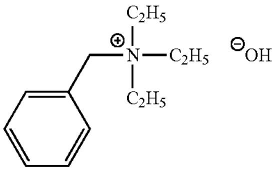

(O-4)

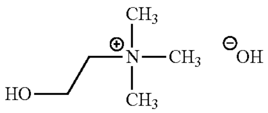

(O-5)

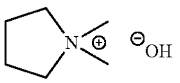

(O-6)

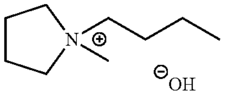

(O-7)

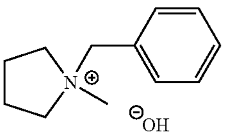

(O-8)

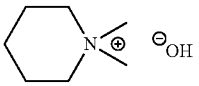

-continued (O-9)
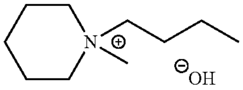

(O-10)
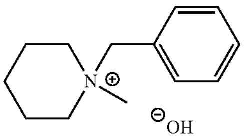

(O-11)
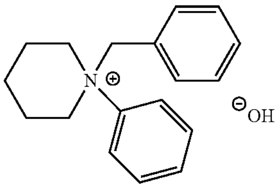

(O-12)
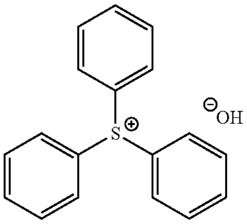

(O-13)
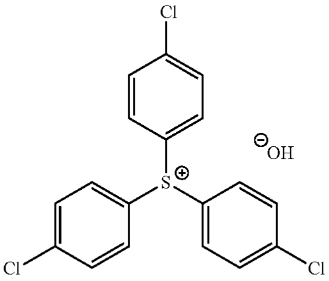

(O-14)
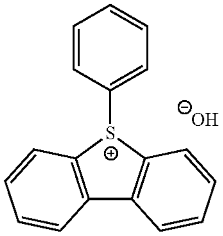

(O-15)
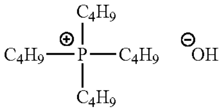

(O-16)
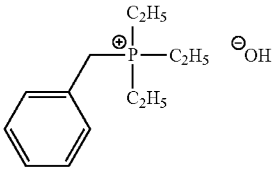

-continued (O-17)
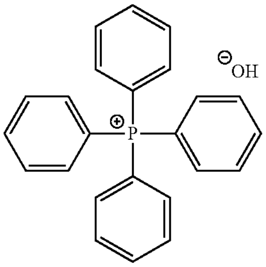

(O-18)
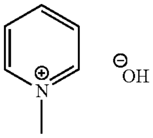

(O-19)
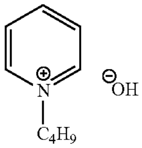

(O-20)
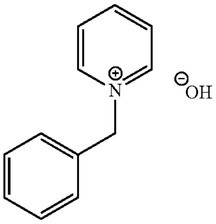

These monovalent basic compounds may be used alone, or in combination of two or more thereof.

The amount of basic compound to be added to a coating liquid composition for forming a lower layer is usually from 0.01 to 30% by mass, and preferably 0.5 to 20% by mass, with respect to the total solid content of the lower layer.

In the present invention, since (A-1) a polymer having carboxylic acid groups and (A-2) a monovalent basic compound are added to a coating liquid composition for forming a lower layer, at least a part of carboxylic acid groups included in the polymer forms a salt structure with (A-2) the monovalent basic compound in a lower layer used in the invention, whereby the effect of the present invention is achieved. From such a viewpoint, the carboxylic acid value of (A-1) a polymer having carboxylic acid groups is preferably from 0.01 mmol/g to 3.00 mmol/g, and more preferably from 0.05 mmol/g to 2.60 mmol/g, from the viewpoint of development property and the strength of the image portion.

The amount (i.e., neutralization amount) of (A-2) a monovalent basic compound used for forming a salt structure with respect to (A-1) a polymer having carboxylic acid groups is preferably from 10 mol % to 100 mol %, more preferably from 15 mol % to 80 mol %, and most preferably from 20 mol % to 60 mol %, with respect to 100 mol % of carboxylic acid groups, from the viewpoints of inhibiting interlayer mixture, and of development property and printing durability.

Whether the carboxylic group in the formed lower layer is forming a salt structure with a monovalent basic compound or not may be confirmed by measuring the acid value by neutralization titration.

Here, the carboxylic acid value of the polymer after forming a salt is preferably from 0.001 mmol/g to 2.00 mmol/g, more preferably from 0.10 mmol/g to 1.80 mmol/g, and most preferably from 0.50 mmol/g to 1.60 mmol/g.

The acid value of the polymer may be measure by neutralization titration.

Specific examples of (A) a binder polymer which is suitable for the present invention and has, in a molecule thereof, a salt structure formed from (A-1) a polymer having carboxylic acid groups and (A-2) a monovalent basic compound are shown below.

| (A) Polymer having salt structure | (A-1) Polymer having carboxylic acid group | (A-2) Monovalent basic compound | (A-2) Addition amount (mol %) |
|---|---|---|---|
| PN-1 | PU-1 | B-5 | 33 |
| PN-2 | PU-1 | B-8 | 33 |
| PN-3 | PU-1 | B-11 | 33 |
| PN-4 | PU-1 | B-12 | 33 |
| PN-5 | PU-1 | B-17 | 33 |
| PN-6 | PU-1 | B-19 | 33 |
| PN-8 | PU-1 | B-31 | 33 |
| PN-9 | PU-1 | B-38 | 33 |
| PN-10 | PU-1 | B-39 | 33 |
| PN-11 | PU-1 | B-42 | 33 |
| PN-12 | PA-1 | B-46 | 33 |
| PN-13 | PA-3 | B-46 | 33 |
| PN-14 | PA-4 | B-46 | 33 |
| PN-15 | PA-9 | B-46 | 33 |
| PN-16 | PA-10 | B-46 | 33 |
| PN-17 | PB-1 | B-46 | 33 |
| PN-18 | PB-4 | B-46 | 33 |
| PN-19 | PU-1 | B-46 | 15 |
| PN-20 | PU-1 | B-46 | 33 |
| PN-21 | PU-1 | B-46 | 66 |
| PN-22 | PU-1 | B-46 | 100 |
| PN-23 | PU-3 | B-46 | 33 |
| PN-24 | PU-9 | B-46 | 33 |
| PN-25 | PU-11 | B-46 | 33 |
| PN-26 | PU-19 | B-46 | 33 |
| PN-27 | PU-20 | B-46 | 33 |
| PN-28 | PU-21 | B-46 | 33 |
| PN-29 | PU-22 | B-46 | 33 |
| PN-30 | PU-23 | B-46 | 33 |
| PN-31 | PU-25 | B-46 | 33 |
| PN-32 | PU-26 | B-46 | 33 |
| PN-33 | PU-27 | B-46 | 33 |
| PN-34 | PU-28 | B-46 | 33 |
| PN-35 | PU-31 | B-46 | 33 |
| PN-36 | PU-32 | B-46 | 33 |
| PN-37 | PU-33 | B-46 | 33 |
| PN-38 | PU-6 | B-46 | 33 |
| PN-39 | PU-7 | B-46 | 33 |
| PN-40 | PU-8 | B-46 | 33 |
| PN-41 | PU-16 | B-46 | 33 |
| PN-42 | PU-17 | B-46 | 33 |
| PN-43 | PU-18 | B-46 | 33 |
| PN-44 | PU-36 | B-46 | 33 |
| PN-45 | PU-37 | 8-46 | 33 |
| PN-46 | PU-38 | B-46 | 33 |
| PN-47 | PU-39 | B-46 | 33 |
| PN-48 | PU-40 | B-46 | 33 |
| PN-49 | PU-41 | B-46 | 33 |
| PN-50 | PU-42 | B-46 | 33 |
| PN-51 | PU-1 | O-2 | 33 |
| PN-52 | PU-1 | O-9 | 33 |
| PN-53 | PU-1 | O-10 | 33 |
| PN-54 | PU-1 | O-11 | 33 |
| PN-55 | PU-1 | O-13 | 33 |
| PN-56 | PU-1 | O-15 | 33 |
| PN-57 | PU-1 | O-19 | 33 |
| PN-58 | PA-10 | O-2 | 33 |
| PN-59 | PU-28 | O-2 | 33 |
| PN-60 | PU-28 | O-10 | 33 |

Infrared Absorbing Agent

The planographic printing plate precursor of the present invention further contains (B) an infrared absorbing agent in a lower layer.

The infrared absorbing agent is not particularly limited as long as the agent is a dye which absorbs an infrared ray and generates heat, and a variety of dyes known as an infrared absorbing agent may be used.

As an infrared absorbing agent which may be used in the present invention, commercially available dyes and known dyes described in literatures (for example, "Dye Handbook" edited by the Society of Organic Synthetic Chemistry, published in 1970) may be used. Specific examples of the dye include azo dyes, metal complex azo dyes, pyrazolone azo dyes, anthraquinone dyes, phthalocyanine dyes, carbonium dyes, quinonimine dyes, methine dyes and cyanine dyes. In the present invention, among these dyes, those which absorb at least infrared ray or near-infrared ray are preferred from the viewpoint of using a laser that emits infrared ray or near-infrared ray, and cyanine dyes are particularly preferred.

Examples of such dyes which absorb at least infrared ray or near-infrared ray include cyanine dyes described in JP-A No. 58-125246, JP-A No. 59-84356, JP-A No. 59-202829, JP-A No. 60-78787 or the like, methine dyes described in JP-A No. 58-173696, JP-A No. 58-181690, JP-A No. 58-194595 or the like, naphthoquinone dyes described in JP-A No. 58-112793, JP-A No. 58-224793, JP-A No. 59-48187, JP-A No. 59-73996, JP-A No. 60-52940, JP-A No. 60-63744 or the like, squarylium dyes described in JP-A No. 58-112792 or the like, and cyanine dyes described in GB 434,875B.

As the dye, a near-infrared absorbing agent described in U.S. Pat. No. 5,156,938 is also suitably used, and a substituted arylbenzo(thio)pyrylium salt described in U.S. Pat. No. 3,881,924, a trimethine thiapyrylium salt described in JP-A No. 57-142645 (U.S. Pat. No. 4,327,169), a pyrylium compound described in JP-A No. 58-181051, JP-A No. 58-220143, JP-A No. 59-41363, JP-A No. 59-84248, JP-A No. 59-84249, JP-A No. 59-146063 or JP-A No. 59-146061, a cyanine dye describes in JP-A No. 59-216146, a pentamethinethiopyrylium salt described in U.S. Pat. No. 4,283,475, a pyrylium compound or the like disclosed in JP-A No. 05-13514 or 05-19702, and commercially-available dyes such as EPOLIGHT 111-178, EPOLIEGHT 111-130, or EPOLIGHT 111-125 (trade names, manufactured by Epolin Inc.) are particularly preferably used.

Other examples of particularly preferred dye include near-infrared absorbing dyes represented by formulae (I) and (II) disclosed in U.S. Pat. No. 4,756,993.

Among these dyes, examples of particularly preferred dyes include cyanine dyes, phthalocyanine dyes, oxonol dyes, squarylium dyes, pyrylium salts, thiopyrylium dyes and nickel thiolate complexes. It is preferable to use a cyanine dye represented by the following Formula (a) in a lower layer in the present invention, because a high polymer activity is imparted to the layer, and stability and economic efficiency are improved.

Formula (a)

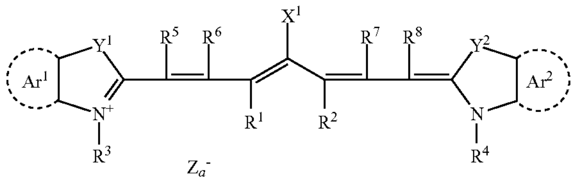

In Formula (a), $X^1$ represents a hydrogen atom, a halogen atom, —$NPh_2$, $X^2$-$L^1$ or a group represented by the structural formula shown below, in which $X^2$ represents an oxygen atom or a sulfur atom, and $L^1$ represents a hydrocarbon group having 1 to 12 carbon atoms, an aromatic ring having a hetero atom, or a hydrocarbon which has 1 to 12 carbon atoms and contains a hetero atom. Here, examples of the hetero atom include N, S, O, a halogen atom, and Se.

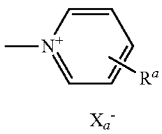

In the above structural formula, $Xa^-$ has the same definition as $Za^-$ described below, and $R^a$ represents a substituent selected from the group consisting of a hydrogen atom, an alkyl group, an aryl group, a substituted or unsubstituted amino group and a halogen atom.

In Formula (a), $R^1$ and $R^2$ independently represent a hydrocarbon group having 1 to 12 carbon atoms. From the viewpoint of the preservation stability of a coating liquid for a photosensitive layer, $R^1$ and $R^2$ preferably each represent a hydrocarbon group having two or more carbon atoms, and it is particularly preferable that $R^1$ and $R^2$ are bonded to each other to form a 5-member or 6-member ring.

In Formula (a), $Ar^1$ and $Ar^2$ may be the same as or different from each other, and independently represent an aromatic hydrocarbon group optionally having a substituent. Preferred examples of the aromatic hydrocarbon group include a benzene ring and naphthalene ring. Further, preferred examples of the substituent include a hydrocarbon group having 12 or less carbon atoms, a halogen atom, and an alkoxy group having 12 or less carbon atoms.

In Formula (a), $Y^1$ and $Y^2$ may be the same as or different from each other, and independently represent a sulfur atom or a dialkylmethylene group having 12 or less carbon atoms; $R^3$ and $R^4$ may be the same as or different from each other, and independently represent a substituted or unsubstituted hydrocarbon group having 20 or less carbon atoms. Preferred examples of the substituent include an alkoxy group having 12 or less carbon atoms, a carboxyl group and a sulfo group.

In Formula (a), $R^5$, $R^6$, $R^7$ and $R^8$, which may be the same as or different from each other, independently represent a hydrogen atom or a hydrocarbon group having 12 or less carbon atoms. From the viewpoint of the availability of the raw material, a hydrogen atom is preferred. In Formula (a), $Za^-$ represents a counter anion. It should be noted that, when a cyanine dye represented by Formula (a) has an anionic substituent in the structure thereof and it is not necessary to neutralize the electric charge thereof, $Za^-$ is not needed (i.e., $Za^-$ may not be present). From the viewpoint of preservation stability, examples of $Za^-$ preferably include a halogen ion, a perchlorate ion, a tetrafluoro borate ion, a hexafluoro phosphate ion, and a sulfonate ion, and a perchlorate ion, a hexafluoro phosphate ion and an aryl sulfonate ion are particularly preferable.

Specific examples of the cyanine dye represented by Formula (a) which may be suitably used in the invention include those described in paragraphs [0017] to [0019] of JP-A No. 2001-133969, in paragraphs [0012] to [0038] of JP-A No. 2002-40638, and in paragraphs [0012] to [0023] or JP-A No. 2002-23360.

A particularly preferred example of infrared absorbing agent included in a lower layer is a cyanine dye A shown below.

Cyanine dye A

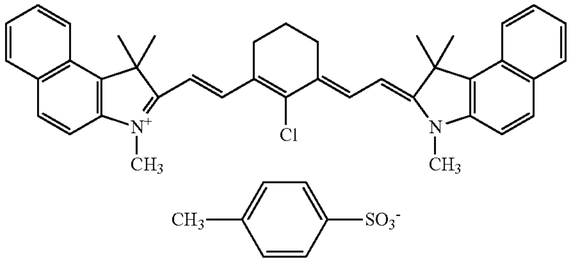

The amount of infrared absorbing agent to be added to a lower layer is preferably from 0.01 to 50% by weight, more preferably from 0.1 to 30% by weight, and particularly preferably from 1.0 to 30% by weight, with respect to the total solid content of a lower layer. When the amount of infrared absorbing agent added is 0.01% by weight or more, the layer has a high sensitivity, and when the amount of infrared absorbing agent added is 50% by weight or less, the layer has a good uniformity and an excellent durability.

In the invention, as long as the effect of the present invention is not impaired, the lower layer may further contain additional components as desired, other than (A) a polymer having, in a molecule thereof, a salt structure formed from a monovalent basic compound and a carboxylic acid group and (B) an infrared absorbing agent.

Examples of additional components include an alkali-soluble resin (which may be referred to as "additional alkali-soluble resin") having a different structure from that of (A) a polymer having, in a molecule thereof, a salt structure formed from a monovalent basic compound and a carboxylic acid group.

Additional Alkali-Soluble Resin

In the present invention, "alkali solubility" means that a compound (for example, a polymer) is capable of dissolving in an aqueous alkaline solution having a pH of 8.5 to 13.5 in a process within a standard developing time.

The additional alkali-soluble resin used in a lower layer is not particularly limited, as long as the resin dissolves when it is brought into contact with an alkaline developing liquid. The additional alkali-soluble resin is preferably an alkali-soluble resin having, as a main chain and/or at a side chain in the polymer, an acidic functional group, a phenolic hydroxyl group, a sulfonate group, a phosphate group, sulfonamide group, an active imide group or the like. Examples thereof preferably include a resin containing 10 mol % or more of a monomer having an acidic functional group that provides an alkali solubility, and more preferably include a resin containing 20 mol % or more of a monomer having an acidic functional group that provides an alkali solubility. When 10 mol % or more of a monomer that provides an alkaline solubility is contained as a polymer component, a sufficient alkali solubility is obtained, and an excellent development property is also obtained.

Examples of alkali soluble resins preferably include novolac resins.

Examples of novolac resins which may be used in the present invention preferably include novolac resins such as a phenol formaldehyde resin, an m-cresol formaldehyde resin, a p-cresol formaldehyde resin, a m-/p-mixed cresol formaldehyde resin or a phenol/cresol (m-, p-, or m-/p-mixed may be employed) mixed formaldehyde resin and pyrogallol acetone resins.

Examples of novolac resins further include a condensation polymer of a phenol having, as a substituent, an alkyl group having 3 to 8 carbon atoms and formaldehyde, as described in U.S. Pat. No. 4,123,279, such as a t-butylphenol formaldehyde resin or an octylphenol formaldehyde resin. The weight-average molecular weight (Mw) thereof is preferably 500 or higher, and more preferably 1,000 to 700,000. The number-average molecular weight (Mn) thereof is preferably 500 or higher, and more preferably 750 to 650,000. The dispersity (i.e., weight-average molecular weight/number-average molecular weight) thereof is preferably from 1.1 to 10.

The additional alkali-soluble resin preferably has a weight-average molecular weight of 2,000 or higher and a number-average molecular weight of 500 or higher, and more preferably has a weight-average molecular weight of 5,000 to 300,000 and a number-average molecular weight of 800 to 250,000. The dispersity (weight-average molecular weight/number-average molecular weight) of additional alkali-soluble resin is preferably from 1.1 to 10.

The additional alkali-soluble resins optionally contained in a lower layer of an image recording material of the present invention may be used alone, or in combination of two or more thereof.

The content of additional alkali-soluble resin is from 0 to 98% by weight, with respect to the total solid content of a lower layer in the present invention. The additional alkali-soluble resin may be contained in a ratio of 80 parts by mass or less based on 100 parts by mass of (A-1) a polymer having carboxylic acid groups at side chains thereof, respectively.

Upper Layer Whose Solubility to an Aqueous Alkaline Solution is Increased by Heat The upper layer of an image forming material of the present invention is an infrared sensitive positive-working recording layer whose solubility to an aqueous alkaline solution is improved by heat.

The mechanism by which the solubility of upper layer to an aqueous alkaline solution is improved by heat is not particularly restricted, and any mechanism may be employed as long as a binder resin is used and the solubility of a heated region improves. Examples of heat used for forming an image include the heat generated when a lower layer containing an infrared absorbing agent is exposed to light.

Examples of upper layer whose solubility to an aqueous alkaline solution is improved by heat include a layer containing an alkali-soluble resin having a hydrogen-bonding ability, such as a novolac or urethane resin, a layer containing a water-insoluble and alkali-soluble resin and a compound having a solubility inhibiting effect, and a layer containing a compound capable of being ablated.

Furthermore, when an infrared absorbing agent is added to an upper layer, the heat generated in the upper layer also may be used for forming an image. Examples of the configuration of upper layer containing an infrared absorbing agent include a layer containing an infrared absorbing agent, a water-insoluble and alkali-soluble resin, and a compound having a solubility inhibiting effect; and a layer containing an infrared absorbing agent, a water-insoluble and alkali-soluble resin, and a compound that generates an acid by heat.

In the following, components to be contained in an upper layer are described.

Water-Insoluble and Alkali-Soluble Resin

The upper layer in the present invention preferably contains a water-insoluble and alkali-soluble resin. When the upper layer contains an alkali soluble resin, an interaction is formed between an infrared absorbing agent and a polar group which an alkali soluble resin has, and a layer having a positive-working photosensitivity is formed.

General water-insoluble and alkaline-soluble resins are described in detail hereinbelow. Examples thereof preferably include polyamide resins, epoxy resins, polyacetal resins, acrylic resins, methacrylic resins, polystyrene resins and novolac phenol resins.

The alkaline-soluble resin which may be used in the present invention is not particularly restricted as long as the resin is capable of dissolving when it is brought into contact with an alkaline developing liquid, and is preferably a single polymer containing an acidic group as a main chain and/or at a side chain of the polymer, or a copolymer thereof or a mixture thereof.

The alkali-soluble resin having such an acidic group preferably has a functional group such as a phenolic hydroxyl group, a carboxyl group, a sulfonate group, a phosphate group, a sulfonamide group, or an active imide group. Thus, such a resin may be suitably produced by copolymerizing a monomer mixture containing one or more ethylenically unsaturated monomers having the above-mentioned functional group. Examples of the ethylenically unsaturated monomers having the above-mentioned functional group preferably include acrylic acid, methacrylic acid, as well as the compounds represented by the following formulae and mixtures thereof. In the following formulae, $R^4$ represents a hydrogen atom or a methyl group.

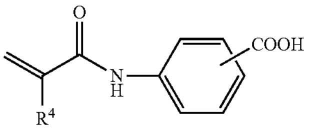

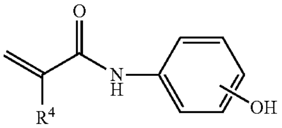

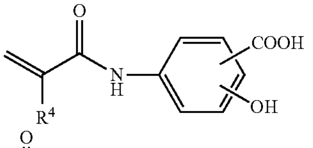

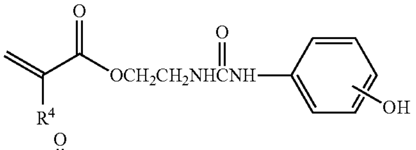

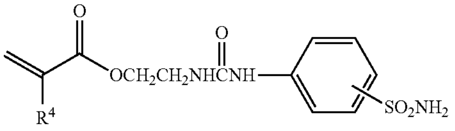

-continued

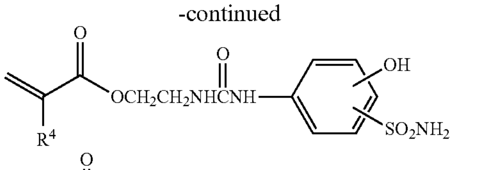

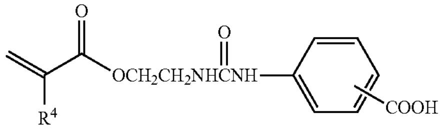

Examples of alkali-soluble resin which may be used in the present invention preferably include a polymer compound obtained by copolymerizing an additional polymerizable monomer other than the above-mentioned polymerizable monomer. In this case, regarding a copolymerization ratio, a monomer that provides an alkali solubility, such as a monomer having a functional group such as a phenolic hydroxyl group, a carboxyl group, a sulfonate group, a phosphate group, a sulfonamide group or an active imide group, is preferably contained in an amount of 10 mol % or more, and more preferably contained in an amount of 20 mol % or more. When 10 mol % or more of a monomer that provides an alkaline solubility is contained as a polymer component, a sufficient alkali solubility is obtained and an excellent development property is also obtained.

Examples of additional polymerizable monomer which may be used include the following compounds:

alkyl acrylates and alkyl methacrylates such as methyl acrylate, ethyl acrylate, propyl acrylate, benzyl acrylate, methyl methacrylate, ethyl methacrylate, cyclohexyl methacrylate, or benzyl methacrylate;

acrylic acid esters and methacrylic acid esters having an aliphatic hydroxyl group, such as 2-hydroxyethyl acrylate or 2-hydroxyethyl methacrylate;

acrylamide or methacrylamide such as acrylamide, methacrylamide, N-methylacrylamide, N-ethylacrylamide or N-phenylacrylamide;

vinyl esters such as vinyl acetate, vinyl chloroacetate, vinyl butyrate or vinyl benzoate;

styrenes such as styrene, α-methyl styrene, methyl styrene or chloromethyl styrene;

other nitrogen atom-containing monomers such as N-vinylpyrrolidone, N-vinylpyridine, acrylonitrile or methacrylonitrile; and maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, or N-hydroxyphenylmaleimide.

Among these additional ethylenically unsaturated monomers, (meth)acrylates, (meth)acrylamides, maleimides and (meth)acrylonitrile are suitably used.

Examples of the alkali-soluble resin also preferably include the novolac resins exemplified as the additional resins suitably used in a lower layer.

Examples of the novolac resins which may be used in the present invention are the same resins as explained for the lower layer, and the preferred examples thereof are also the same as explained for the lower layer.

The water-insoluble and alkali-soluble resin preferably has a weight-average molecular weight of 2,000 or higher and a number-average molecular weight of 500 or higher, and more preferably has a weight-average molecular weight of from 5,000 to 300,000 and a number-average molecular weight of from 800 to 250,000. The dispersity (i.e., weight-average molecular weight/number-average molecular weight) of the alkali soluble resin is preferably from 1.1 to 10.

The alkali-soluble resin used in an upper layer of the image recording materials of the present invention may be used alone, or in combination of two or more thereof.

The content of alkali-soluble resin is preferably from 2.0 to 99.5% by weight, more preferably from 10.0 to 99.0% by weight, and still more preferably from 20.0 to 90.0% by weight, with respect to the total solid content of an upper layer. When the amount of the alkali-soluble resin to be added is 2.0% by weight or more, a recording layer (i.e., a photosensitive layer) is excellent in durability, and when the amount of the alkali soluble resin to be added is 99.5% by weight or less, both of the sensitivity and the durability are excellent.

Acid-Generating Agent

From the viewpoint of improving sensitivity, the upper layer of the image recording layer preferably contains an acid-generating agent.

In the present invention, the acid-generating agent refers to a compound which generates an acid in response to light or heat, for example, a compound which generates an acid when irradiated with an infrared ray or heated at a temperature of 100° C. As the acid to be generated, a strong acid having a pKa of 2 or less, such as sulfonic acid or hydrochloric acid is preferred. An acid generated from the acid-generating agent functions as a catalyst, and the chemical bond in the acid-degradable group cleaves to form an acid group, whereby the solubility of upper layer to an aqueous alkaline solution is further improved.

Examples of the acid-generating agent which may be suitably used in the present invention include onium salts such as iodonium salts, sulfonium salts, phosphonium salts or diazonium salts. Specific examples thereof include the compounds described in U.S. Pat. No. 4,708,925 or JP-A No. 07-20629. In particular, iodonium salts, sulfonium salts or diazonium salts whose counter ion is a sulfonate ion are particularly preferred. Examples of the diazonium salts include diazonium compounds described in U.S. Pat. No. 3,867,147, diazonium compounds described in U.S. Pat. No. 2,632,703, and diazo resins described in JP-A Nos. 01-102456 and 01-102457. Benzylsulfonates described in U.S. Pat. No. 5,135,838 or U.S. Pat. No. 5,200,544 are also preferred. Further, active sulfonates or disulfonyl compounds described in JP-A No. 02-100054, JP-A No. 02-100055 and JP-A No. 08-9444 are also preferred. Haloalkyl-substituted s-triazines describe in JP-A No. 07-271029 are also preferred.

Further, a compound described as an "acid precursor" in JP-A No. 08-220752, a compound described as "(a) compound capable of generating an acid when irradiated with an active light ray" in JP-A No. 09-171254, or the like also may be used as an acid-generating agent to be used in the present invention.

Among these, from the viewpoints of sensitivity and stability, onium salt compounds are preferably used as the acid-generating agent. In the following, onium salt compounds are explained.

Examples of onium salt compounds which may be suitably used in the present invention include compounds known to be degraded by infrared ray exposure or a heat energy generated by light exposure of an infrared absorbing agent and generates an acid. From the viewpoint of sensitivity, examples of onium salt compounds preferably used in the present invention include a known thermal polymerization initiator, and onium salt compounds having an onium salt structure shown below, which has a bond having a small bond dissociation energy.

Examples of onium salts suitably used in the present invention include known diazonium salts, an iodonium salt, a sulfonium salt, an ammonium salt, a pyridinium salt and an azinium salt. Among these, sulfonic acid salts and carboxylic acid salts of triarylsulfonium or diaryliodonium, $BF_4^-$, $PF_6^-$ and $ClO_4^-$ are preferred.

Examples of onium salts which may be used as the acid-generating agent in the present invention include onium salts represented by the following Formulae (III) to (V):

Formula (III)

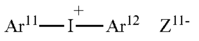

Formula (IV)

Formula (V)

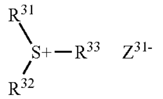

In Formula (III), $Ar^{11}$ and $Ar^{12}$ independently represent an aryl group which has 20 or less of carbon atoms and optionally has a substituent. When the aryl group has a substituent, preferred examples of the substituent include a halogen atom, a nitro group, an alkyl group having 12 or less of carbon atoms, an alkoxy group having 12 or less of carbon atoms and an aryloxy group having 12 or less of carbon atoms. $Z^{11-}$ represents a counter ion selected from the group consisting of a halogen ion, a perchlorate ion, a tetrafluoroborate ion, a hexafluorophosphate ion, a sulfonate ion, and a sulfonate ion having a fluorine atom such as perfluoroalkylsulfonate ion, and is preferably a perchlorate ion, a hexafluorophosphate ion, an aryl sulfonate ion or a perfluoroalkylsulfonate ion.

In Formula (IV), $Ar^{21}$ represents an aryl group which has 20 or less carbon atoms and optionally has a substituent. Preferred examples of the substituent include a halogen atom, a nitro group, an alkyl group having 12 or less of carbon atoms, an alkoxy group having 12 or less of carbon atoms, an aryloxy group having 12 or less of carbon atoms, an alkylamino group having 12 or less of carbon atoms, a dialkylamino group having 12 or less of carbon atoms, an arylamino group having 12 or less of carbon atoms, and a diarylamino group having 12 or less of carbon atoms. $Z^{21-}$ represents a counter ion and has the same definition as $Z^{11-}$.

In Formula (V), $R^{31}$, $R^{32}$ and $R^{33}$, which may be the same as or different from each other, independently represent a hydrocarbon which has 20 or less of carbon atoms and optionally has a substituent. Preferred examples of the substituent include a halogen atom, a nitro group, an alkyl group having 12 or less of carbon atoms, an alkoxy group having 12 or less of carbon atoms and an aryloxy group having 12 or less of carbon atoms. $Z^{31-}$ represents a counter ion and has the same definition as $Z^{11-}$.

Specific examples of onium salts (Exemplary onium salts [OI-1] to [OI-10]) each represented by Formula (III), onium salts (Exemplary onium salts [ON-1] to [ON-5]) each represented by Formula (IV), and onium salts (Exemplary onium salts [OS-1] to [OS-6]) each represented by Formula (V), which may be suitably used in the present invention, are shown below:

[OI-1]

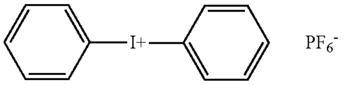

[OI-2]

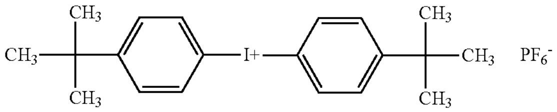

[OI-3]

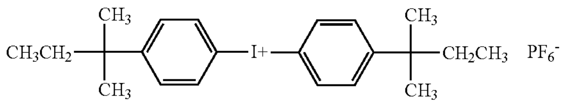

[OI-4]

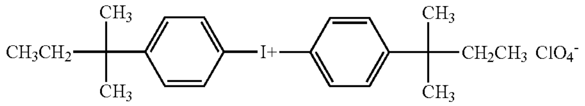

[OI-5]

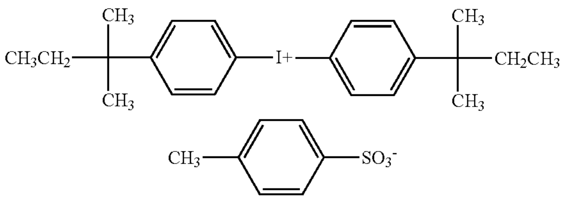

[OI-6]

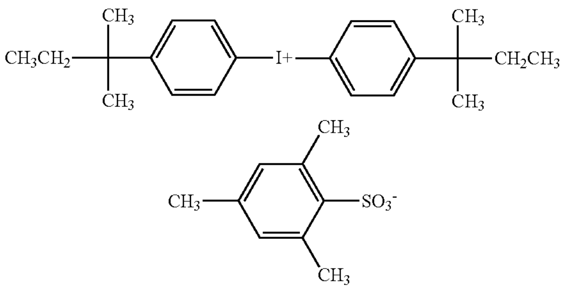

[OI-7]

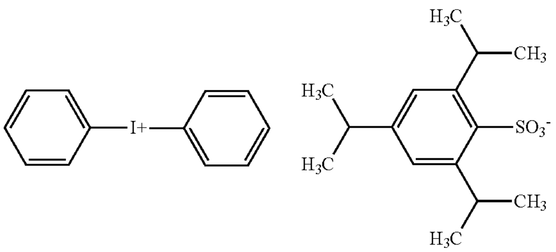

[OI-8]

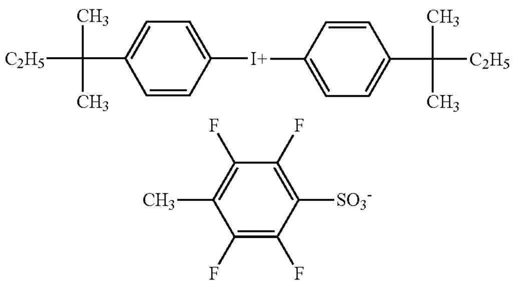

-continued
[OI-9]
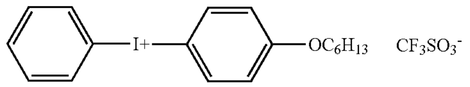
[OI-10]
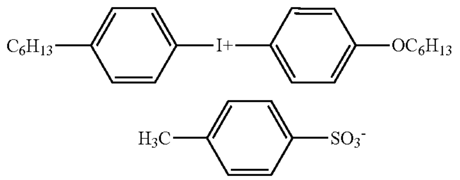
[ON-1]
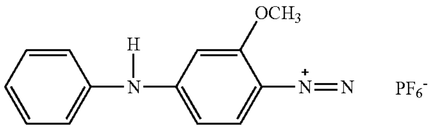
[ON-2]
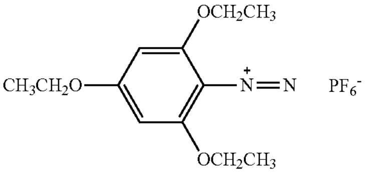
[ON-3]
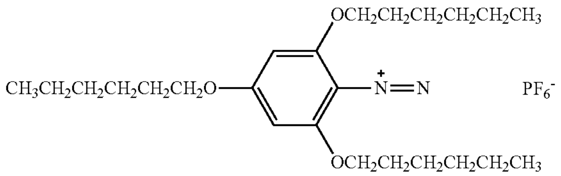
[ON-4]
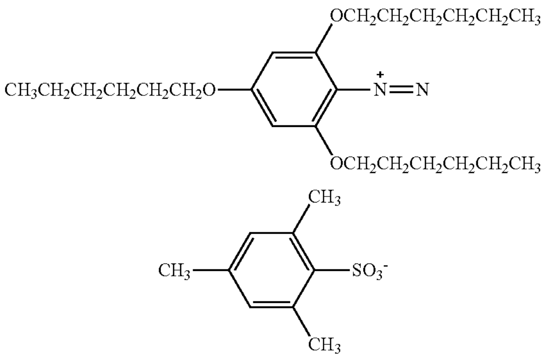
[ON-5]
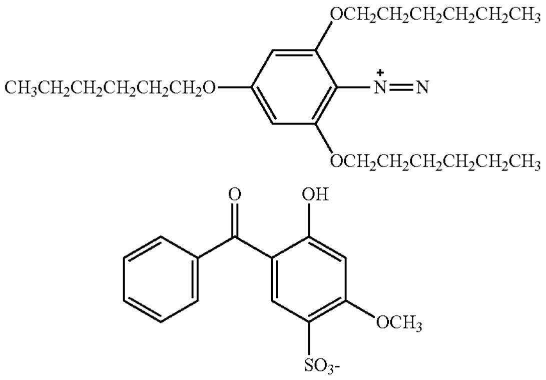
-continued
[OS-1]
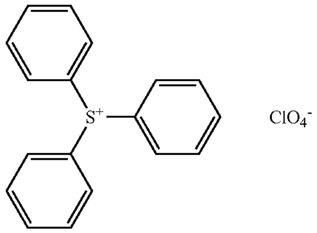
[OS-2]
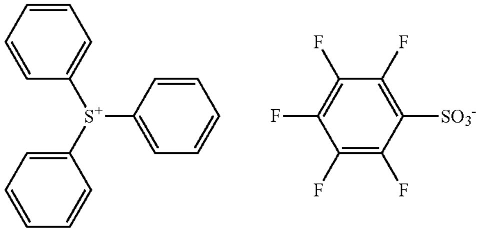
[OS-3]
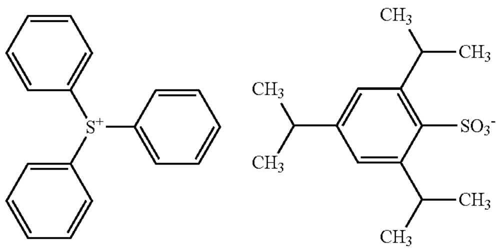
[OS-4]
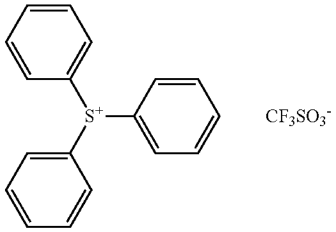
[OS-5]
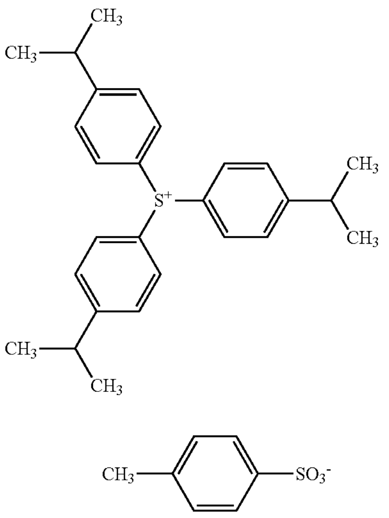

-continued

[OS-6]

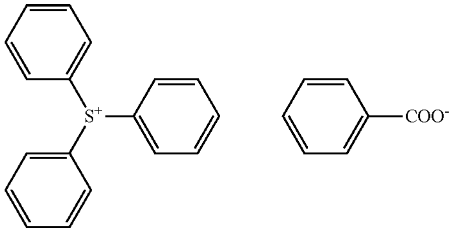

Other examples of compounds represented by Formulae (III) to (V) include compounds described as examples of a radical polymerization initiator in paragraphs [0036] to [0045] of JP-A No. 2008-195018, and any of these may be used as an acid-generating agent in the present invention.

Other examples of onium salts preferably used as the acid-generating agent in the present invention include an azinium salt compound represented by the following Formula (VI).

Formula (VI)

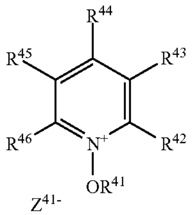

In Formula (VI), $R^{41}$, $R^{42}$, $R^{43}$, $R^{44}$, $R^{45}$ and $R^{46}$, which may the same as or different from each other, independently represent a hydrogen atom, a halogen atom, or a monovalent substituent.

Examples of the monovalent substituent include a halogen atom, an amino group, a substituted amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonato group, a substituted sulfonyl group, a phosphono group, a substituted phosphono group, a phosphonato group and a substituted phosphonato group. If possible, at least one substituent may be additionally introduced.

An example of the compound represented by Formula (VI) include a multimeric compound in which at least two specific structural skeletons (i.e., cationic moieties) of compounds each represented by Formula (VI) are bound to each other via $R^{41}$, and may also be suitably used.

In Formula (VI), $Z^{41-}$ represents a counter ion, and has the same definition as $Z^{11-}$.

Specific examples of the azinium salt compound represented by Formula (VI) include the compounds described in paragraphs [0047] to [0056] of JP-A No. 2008-195018.

Examples of the acid-generating agent used in the present invention also preferably include compounds having an N—O bonding, as described in JP-A No. 63-138345, JP-A No. 63-142345, JP-A No. 63-142346, JP-A No. 63-143537 and JP-A No. 46-42363.

Preferred examples of the acid-generating agent which may be used in the present invention include the following compounds (PAG-1) to (PAG-5).

PAG-1

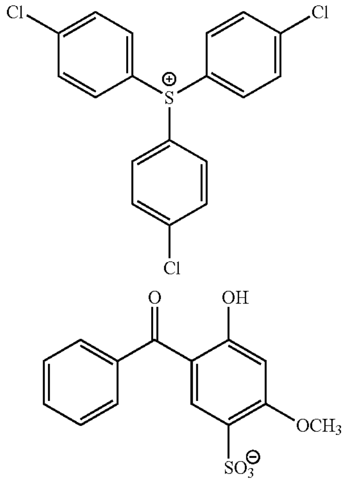

PAG-2

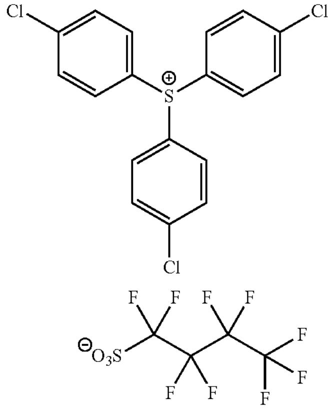

PAG-3

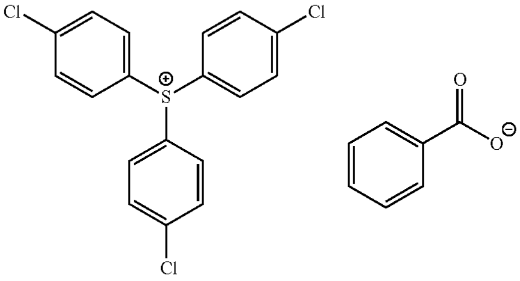

PAG-4

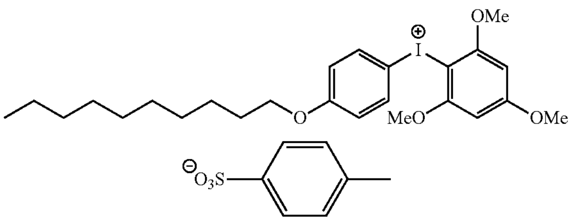

PAG-5

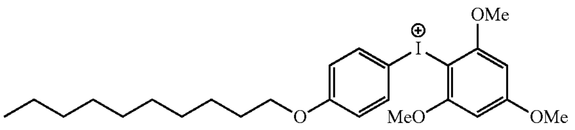

-continued

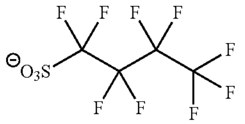

When the acid-generating agent is contained in a positive-working photosensitive composition which is used for forming an upper layer in the invention, only one type of acid-generating agent may be used alone, or a combination of two or more thereof may be used.

When the acid-generating agent is added to an upper layer, the amount of the acid-generating agent to be added is preferably from 0.01 to 50% by weight, more preferably from 0.1 to 40% by weight, and still more preferably from 0.5 to 30% by weight, with respect to the total solid content of the upper layer. When the amount of the acid-generating agent to be added is within the above ranges, improvement in sensitivity, which is an effect achieved by addition of the acid-generating agent, is achieved, as well as the generation of film residues in a non-image region is suppressed.

Acid Amplifier

The upper layer in the present invention may further contain an acid amplifier.

The acid amplifier used in the present invention is a compound which is substituted with a relatively strong acid residue, and is easily detached in the presence of an acid catalyst to newly generate an acid. That is, an acid amplifier is degraded by an acid-catalyzed reaction and generates an acid (hereinafter, referred to as ZOH in a formula) again. Since at least one acid is increased in one reaction, and the acid concentration increases at an accelerated rate with the progress of the reaction, the sensitivity is tremendously improved. The intensity of the generated acid is 3 or lower in terms of an acid dissociation constant (pKa), and preferably 2 or lower. When the acid is weaker than the above, the elimination reaction by an acid catalyst does not occur.

Examples of an acid used for such an acid catalyst include dichloroacetic acid, trichloroacetic acid, methanesulfonic acid, ethanesulfonic acid, benzenesulfonic acid, p-toluenesulfonic acid, naphthalene sulfonic acid and phenyl sulfonic acid.

Examples of the acid amplifier include the acid amplifiers described in WO 95/29968, WO 98/24000, JP-A No. 08-305262, JP-A No. 09-34106, JP-A No. 08-248561, JP-A No. 08-503082, U.S. Pat. No. 5,445,917, JP-A No. 08-503081, U.S. Pat. No. 5,534,393, U.S. Pat. No. 5,395,736, U.S. Pat. No. 5,741,630, U.S. Pat. No. 5,334,489, U.S. Pat. No. 5,582,956, U.S. Pat. No. 5,578,424, U.S. Pat. No. 5,453,345, U.S. Pat. No. 5,445,917, EP 665,960, EP 757,628, EP 665,961, U.S. Pat. No. 5,667,943, JP-A No. 10-1598, or the like, and these may be used alone, or in combination of two or more thereof.

Preferred specific examples of the acid amplifier used in the invention include the compounds describe in paragraphs [0056] to [0067] of JP-A No. 2001-66765. Among these, the compounds disclosed as (ADD-1), (ADD-2) and (ADD-3), which are shown below, are suitably used.

(ADD-1)

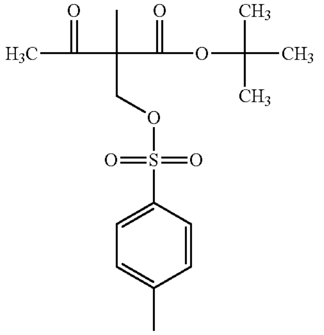

(ADD-2)

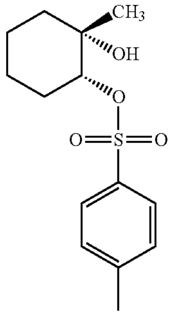

(ADD-3)

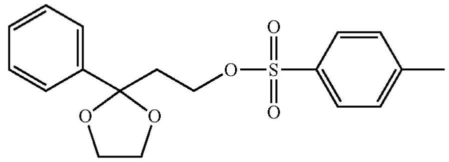

When the acid amplifier is added to an upper layer, the amount of the acid amplifier to be added is from 0.01 to 20% by weight, preferably from 0.01 to 10% by weight, and more preferably from 0.1 to 5% by weight, with respect to the total solid content of the upper layer. When the amount of the acid amplifier to be added is in the above ranges, the effect achieved by the addition of acid amplifier is sufficiently obtained, the improvement of the sensitivity is attained, as well as the decrease in the film strength of an image region is suppressed, whereby an excellent film strength of an image portion caused by a specific polyurethane is maintained.

Further, in an upper layer in the present invention, other resins may be used in combination as long as the effect of the present invention is not impaired. Since the upper layer itself needs to exhibit alkali solubility particularly in a non-image region, it is necessary to select a resin which does not impair the characteristics. From this viewpoint, examples of resins which may be used in combination include a water-insoluble and alkali-soluble resin. General water-insoluble and alkali-soluble resins are described in detail hereinbelow, and examples thereof include a polyamide resin, an epoxy resin, a polyacetal resin, an acrylic resin, a methacrylic resin, a polystyrene resin, and a novolac phenolic resin.

The amount of the additional resin to be added is preferably 50% by weight or smaller with respect to the water-insoluble and alkali soluble resin.

Infrared Absorbing Agent

The upper layer of the present invention may contain an infrared absorbing agent, as the lower layer. The infrared absorbing agent is not particularly restricted as long as the agent is a dye which absorbs an infrared light and generates heat, and any one of the infrared absorbing agents which may be used in the lower layer may be used in the upper layer.

Particularly preferred dye is the cyanine dye represented by Formula (a).

When the upper layer contains an infrared absorbing agent, the sensitivity becomes preferable.

The amount of the infrared absorbing agent to be added in an upper layer added is preferably from 0.01 to 50% by weight, more preferably from 0.1 to 30% by weight, and particularly preferably from 1.0 to 10% by weight, with respect to the total solid content of the upper layer. When the amount of the infrared absorbing agent to be added is 0.01% by weight or more, the sensitivity of the layer is improved, and when the amount of the infrared absorbing agent to be added is 50% by weight or less, the layer has a good uniformity and an excellent durability.

Other Additives

When a lower layer and an upper layer are formed, a variety of additives other than the above-mentioned essential components, may be further added to the layers as required, as long as the effect of the present invention is not impaired. The additives described below may be added only to the lower layer, only to the upper layer, or to both layers.

Development Accelerator

In order to improve sensitivity, any one of acid anhydrides, phenols, organic acids, and the like may be added to an upper layer and/or a lower layer.

As the acid anhydrides, cyclic acid anhydrides are preferred, and specific examples of the cyclic acid anhydrides include phthalic anhydride, tetrahydrophthalic anhydride, hexahydrophthalic anhydride, 3,6-endoxy tetrahydrophthalic anhydride, tetrachlorophthalic anhydride, maleic anhydride, chloromaleic anhydride, α-phenylmaleic anhydride, succinic anhydride and pyromellitic dianhydride, which are described in U.S. Pat. No. 4,115,128. Examples of non-cyclic acid anhydrides include acetic anhydride.

Examples of phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Examples of the organic acids are described in, for example, JP-A No. 60-88942 and JP-A No. 02-96755, and specifically include p-toluenesulfonic acid, dodecyl benzene sulfonic acid, p-toluenesulfinic acid, ethyl sulfuric acid, phenyl phosphonic acid, phenyl phosphinic acid, phenyl phosphoric acid, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid. The proportion (total content) of the acid anhydrides, phenols and organic acids is preferably from 0.05 to 20% by weight, more preferably from 0.1 to 15% by weight, and particularly preferably from 0.1 to 10% by weight, with respect to the total solid content of the lower layer or the upper layer.

Surfactant

In order to improve coating properties, and/or in order to achieve development stability in various conditions, the upper layer and/or the lower layer may further contain a non-ionic surfactant described in JP-A No. 62-251740 and JP-A No. 03-208514, an amphoteric surfactant described in JP-A No. 59-121044 and JP-A No. 04-13149, or a fluorine-containing monomer polymer described in JP-A No. 62-170950, JP-A No. 11-288093, and JP-A No. 2003-57820.

Specific examples of the non-ionic surfactant include sorbitan tristearate, sorbitan monopalmitate, sorbitan triolate, stearic acid monoglyceride and polyoxyethylene nonyl phenyl ether.

Specific examples of the amphoteric surfactant include alkyl di(aminoethyl)glycine, alkyl polyaminoethyl glycine hydrochloride, 2-alkyl-N-carboxyethyl-N-hydroxyethyl imidazolinium betaine and N-tetradecyl-N,N-betaine (for example, trade name: "AMOGEN K", manufactured by Daiichi Kogyo Seiyaku Co., Ltd.).

The proportion (total content) of the surfactant in the lower layer or upper layer is preferably from 0.01 to 15% by weight, more preferably from 0.01 to 5% by weight, and still more preferably from 0.05 to 2.0% by weight, with respect to the total solid content of the lower layer or upper layer.

Print-Out Agent Colorant

To the upper layer and/or the lower layer, a print-agent by which a visible image is obtained immediately after heating by exposure, or a dye or a pigment as a colorant for an image may be added.

Examples of print-agents and colorants are described in detail in paragraphs [0122] to [0123] of JP-A No. 2009-229917. The compounds described in the document may be used in the present invention.

The dyes may added in a proportion (total content) of preferably from 0.01 to 10% by weight, and more preferably from 0.1 to 3% by weight, with respect to the total solid content of the lower layer or upper layer.

Plasticizer

To the upper layer and/or the lower layer, a plasticizer may be added in order to impart flexibility to a coating film. For example, oligomers and polymers of butyl phthalyl, polyethylene glycol, tributyl citrate, diethyl phthalate, dibutyl phthalate, dihexyl phthalate, dioctyl phthalate, tricresyl phosphoric acid, tributyl phosphoric acid, trioctyl phosphoric acid, tetrahydrofurfuryl oleate, acrylic acid or methacrylic acid and the like are used.

These plasticizers are added in a proportion (total content) preferably from 0.5 to 10% by weight, and more preferably from 1.0 to 5% by weight, with respect to the total solid content of the lower layer or upper layer.

Wax Agent

In order to provide a scratch-resistance, a compound which decreases the coefficient of static friction at the surface of an upper layer may be added to an upper layer. Specific examples thereof include the compounds having a long chain alkyl carboxylic acid ester as described in U.S. Pat. No. 6,117,913, JP-A No. 2003-149799, JP-A No. 2003-302750 or JP-A No. 2004-12770.

The proportion of the compounds in an upper layer is preferably from 0.1 to 10% by weight, and more preferably from 0.5 to 5% by weight.

Formation of the Lower Layer and the Upper Layer

The lower layer and the upper layer of the planographic printing plate precursor of the present invention may each be formed by dissolving the above-mentioned components in a solvent and applying the resultant solution to a suitable support.

Examples of the solvent which may used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone and toluene, but not limited thereto. These solvents may used alone, or in a mixture of two or more thereof.

It is preferable that the lower layer and the upper layer are basically formed into separate layers.

Examples of a method of forming two separate layers include a method in which the difference in solubilities to a solvent between the components contained in the lower layer and the components contained in the upper layer is used. In the present invention, since (A) a polymer having, in a molecule thereof, a salt structure formed by a monovalent basic compound and a carboxylic acid group is used in the lower layer, the compatibility at the interface between layers is effectively suppressed.

Examples of other methods of separately forming two layers include a method including applying an upper layer by coating, and, immediately after the application, rapidly drying a solvent to remove it. By using this method in combination, the separation between the layers is more favorably attained.

In the following, these methods are described in detail, but the method of separately forming two layers is not limited thereto.

In the method in which the difference between the solubilities of components contained in the lower layer and upper layer to a solvent is used, a solvent which does not dissolve any of the components contained in the lower layer is used when a coating liquid for forming an upper layer is applied, for example. By this, even when two layers are applied, the layers are clearly separated from each other and respectively form coating films. For example, two layers may be formed in such a manner that: a component insoluble to a solvent such as methyl ethyl ketone or 1-methoxy-2-propanol, which dissolves an alkali-soluble resin that is a component of an upper layer, is selected; a lower layer is applied by coating using a solvent which dissolves the component of the lower layer, followed by drying the lower layer; and thereafter an upper layer which mainly contains an alkali-soluble resin which is dissolved in methyl ethyl ketone, 1-methoxy-2-propanol, or the like, followed by drying the upper layer.

Next, a method of drying a solvent extremely rapidly after application of a second layer (i.e., an upper layer), may be performed by blowing a high-pressure air through a slit nozzle provided in the direction approximately perpendicular to the running direction of a web, applying a heat energy as a conductive heat to a web from the under surface of the web using a roll (heating roll) in which a heating medium such as steam is provided, or by a combination of these methods.

The amount (i.e., dry amount) of a lower layer component to be applied on a support of a planographic printing plate precursor of the present invention after drying, is preferably in the range of from 0.5 to 4.0 $g/m^2$, and more preferably in the range of from 0.6 to 2.5 $g/m^2$. When the amount is 0.5 $g/m^2$ or higher, an excellent printing durability is obtained, and when the amount is 4.0 $g/m^2$ or lower, excellent image reproducibility and excellent sensitivity are obtained.

The amount (i.e., dry amount) of an upper layer component to be applied after drying is preferably in the range of from 0.05 to 1.0 $g/m^2$, and more preferably in the range of from 0.08 to 0.7 $g/m^2$. When the amount is 0.05 $g/m^2$ or higher, excellent development latitude and excellent scratch-resistance are obtained, and when the amount is 1.0 $g/m^2$ or lower, an excellent sensitivity is obtained.

The total amount of the lower layer and the upper layer to be applied after drying is preferably in the range of from 0.6 to 4.0 $g/m^2$, and more preferably in the range of 0.7 to 2.5 $g/m^2$. When the total amount is 0.6 $g/m^2$ or higher, an excellent printing durability is obtained, and when the total amount is 4.0 $g/m^2$ or lower, excellent image reproducibility and excellent sensitivity are obtained.

The image recording material of the present invention is applicable to a variety of fields in which formation of a resin pattern having an excellent durability is required, such as fields of resists, displays or planographic printing plate precursors. Since the image recording material enables a high sensitivity recording, and has an excellent image formability and an excellent durability of a formed image region, it may be said that an effect of the present invention is remarkable when the material is applied to an infrared sensitive positive-working planographic printing plate precursor which is described in detail hereinbelow.

Infrared Sensitive Positive-Working Planographic Printing Plate Precursor

The planographic printing plate precursor of the present invention is formed using the image forming material of the present invention. When the image forming material of the present invention is applied to a planographic printing plate precursor, a support having a hydrophilic surface is selectively used as described hereinbelow.

The planographic printing plate precursor of the present invention includes: a support which has a hydrophilic surface; and, on the support, a lower layer containing at least (A) a polymer which has carboxylic acid groups at side chains thereof, at least a part of the carboxylic acid groups forming a salt structure with a monovalent basic compound and (B) an infrared absorbing agent, and an upper layer whose solubility to an alkaline aqueous solution is increased by heat, in this order.

Support

The support used in the image recording material of the present invention is not particularly limited as long as it is a dimensionally-stable plate-shaped material having desired strength and durability. Examples thereof include paper, plastic-laminated paper (examples of plastic include polyethylene, polypropylene, and polystyrene), metal plates (which are made from aluminum, zinc, copper, or the like), plastic films (which are made from diacetyl cellulose, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, or the like), and a paper sheet or plastic film on which any one of the above-mentioned metals has been laminated or deposited.

When the image forming material of the present invention is used for forming a planographic printing plate precursor, the support is preferably a polyester film or an aluminum plate. Among these, an aluminum plate which has a good dimension stability and is relatively inexpensive is particularly preferred. Examples of a suitable aluminum plate include a pure aluminum plate, and an alloy plate which contains aluminum as a main component and a trace amount of other elements. Further the plate may be a plastic film on which aluminum has been laminated or deposited. Examples of other elements which may be contained in the aluminum alloy include silicon, iron, manganese, copper, magnesium, chromium, zinc, bismuth, nickel and titanium. The content of other elements in the alloy is preferably 10% by weight or less.

In the present invention, although particularly preferred aluminum is pure aluminum, it is difficult to manufacture a completely pure aluminum. Therefore, those containing a trace amount of other elements may also be used.

In this manner, the formulation of the aluminum plate used in the present invention is not particularly limited, and an aluminum plate made of a material which is conventionally known and in public use may be used as required. The thickness of the aluminum plate used in the present invention is preferably from 0.1 mm to 0.6 mm, more preferably from 0.15 mm to 0.4, and particularly preferably from 0.2 mm to 0.3 mm.

Such an aluminum plate may be subjected to a surface treatment such as roughening or anodizing. In the surface treatment of the aluminum support, a delipidation process, surface roughening, anodizing or the like using a surfactant, organic solvent, alkaline aqueous solution, or the like as described in paragraphs [0167] to [0169] or JP-A No. 2009-175195 are suitably carried out.

The anodized aluminum surface may be subjected to a hydrophilizing treatment as required.

As a hydrophilizing treatment, a method using an alkali metal silicate (for example, aqueous sodium silicate solution), potassium fluorozirconate, polyvinyl phosphate or the like as described in [0169] of JP-A No. 2009-175195 may be used.

Undercoat Layer

When the image recording material of the present invention is applied to a planographic printing plate precursor, an undercoat layer may be provided between a support and a lower layer as required.

As a component of the undercoat layer, a variety of organic compounds are used, and examples thereof preferably include phosphonic acids having an amino group such as carboxymethyl cellulose or dextrin, organic phosphonic acids, organic phosphoric acids, organic phosphinic acids, amino acids and amine hydrochlorides having a hydroxyl group. The component of the lower layer may be used alone, or in combination of two or more thereof. The detail of the compound used in an undercoat layer and a method of forming an undercoat layer are described, for example, in paragraphs [0171] to [0172] of JP-A No. 2009-175195, disclosure of which is applicable to the present invention.

The amount of organic undercoat layer to be applied is preferably from 2 to 200 mg/m$^2$, and more preferably from 5 to 100 mg/m$^2$. When the coating amount of the layer is within the above ranges, a sufficient printing durability is obtained.

Backcoat Layer

A backcoat layer may be provided on the backside (rear side) of a support of the planographic printing plate as required. As the backcoat layer, a coating layer formed from a metal oxide obtained by hydrolytic cleavage and polycondensation of an organic polymer compound described in JP-A No. 05-45885 and an organic or inorganic metal compound described in JP-A No. 06-35174, is preferably used. Among these coating layers, a metal oxide coating layer obtained using a silicon alkoxy compound such as $Si(OCH_3)_4$, $Si(OC_2H_5)_4$, $Si(OC_3H_7)_4$ or $Si(OC_4H_9)_4$, which is inexpensive and easily obtainable, has an excellent resistance to a developing liquid, which is particularly preferred.

The planographic printing plate precursor manufactured in the above manner is subjected to a pattern exposure, and thereafter, to a development processing.

Method for Manufacturing Planographic Printing Plate

A method for manufacturing a planographic printing plate of the present invention includes: subjecting the infrared sensitive positive-working planographic printing plate precursor of the invention to pattern exposure of an infrared ray (i.e., exposure step); and developing an image using an aqueous alkaline solution having a pH of 8.5 to 10.8 (i.e., development step), in this order.

By the method for manufacturing a planographic printing plate of the present invention, a good "print stability" is obtained, and, in the obtained planographic printing plate, a stain caused by a film residue in a non-image region is not generated, as well as excellent strength and excellent durability in the image region are obtained.

In the following, each process in the method for manufacturing a planographic printing plate of the present invention is described in detail.

Exposure Step

The method for manufacturing a planographic printing plate of the present invention includes an exposure step in which the infrared sensitive positive planographic printing plate precursor of the present invention is subjected to a pattern exposure.

As a light source of active ray used for pattern exposure of the planographic printing plate of the present invention, a light source having an emission wavelength from near-infrared to infrared region is preferred, and a solid laser or a semiconductor laser is more preferred. In particular, a solid laser or a semiconductor laser which emits an infrared ray having a wavelength of from 750 to 1,400 nm is particularly preferred in the present invention.

The output of the laser is preferably 100 mW or higher. In order to shorten the time of exposure, it is preferred to use a multi-beam laser device. The exposure time per one pixel is preferably 20 μsec or shorter.

The energy which is radiated to the planographic printing plate precursor is preferably from 10 to 300 mJ/cm$^2$. When the energy is in the above range, curing proceeds sufficiently, as well as a laser ablation is suppressed and damages on image may be prevented.

The light exposure of the present invention may be carried out by overlapping light beams from the light source. As used herein, "overlap" means that a vertical scan pitch is smaller than the beam diameter. The overlap may be quantitatively represented by FWHM/vertical scan pitch (overlap coefficient) when, for example, the beam diameter is represented by the full width a half maximum (FWHM) of the intensity of the beam. In the present invention, the overlap coefficient is preferably 0.1 or larger.

The scanning method of the light source of an exposure machine which may be used in the present invention is not particularly limited, and examples thereof include an external cylindrical scanning method, an internal cylindrical scanning method and a flat bed scanning method. The channel of the light source may be a single-channel or a multi-channel. When using the external cylindrical scanning method, a multi-channel is preferably used.

Development Step

The method for manufacturing a planographic printing plate of the present invention includes a development step in which a development is carried out using an aqueous alkaline solution having a pH of 8.5 to 10.8.

The aqueous alkaline solution having a pH of 8.5 to 10.8 used in the development step (hereinafter, also referred to as "developing liquid") is an aqueous alkaline solution having a pH of 8.5 to 10.8 and is more preferably an aqueous alkaline solution having a pH of 9.0 to 10.0. The developing liquid preferably contains a surfactant and more preferably contains at least an anionic surfactant or a nonionic surfactant. The surfactant contributes to the improvement of processability.

Examples of surfactant used in a developing liquid include anionic surfactants, nonionic surfactants, cationic surfactants and amphoteric surfactants. As described above, the anionic and nonionic surfactants are preferred.

The anionic surfactants which may be used in a developing liquid in the present invention are not particularly limited, and examples thereof include fatty acid salts, abietates, hydroxyalkanesulfonates, alkanesulfonates, dialkylsulfosuccinates, linear alkylbenzenesulfonates, branched chain alkylbenzenesulfonates, alkylnaphthalenesulfonates, alkyldiphenyl ether (di)sulfonates, alkylphenoxyl polyoxyethylene propylsulfonates, polyoxyethylene alkyl sulfophenyl ether salts, N-methyl-N-oleyl taurine sodium salts, N-alkyl sulfosuccinic acid monoamide disodium salts, petroleum sulfonates, sulfated castor oil, sulfated beef tallow oil, sulfuric ester salts of fatty acid alkyl ester, alkyl sulfuric ester salts, polyoxyethylene alkyl ether sulfuric ester salts, fatty acid monoglyceride sulfuric ester salts, polyoxyethylene alkyl phenyl ether sulfuric ester salts, polyoxyethylene styryl phenyl ether sulfuric ester salts, alkyl phosphoric ester salts, polyoxyethylene alkyl ether phosphoric ester salts, polyoxyethylene alkyl phenyl ether phosphate ester salts, partially saponified copolymer of styrene/maleic anhydride, partially saponified copolymer of olefin/maleic anhydride and naphthalene sulfonate formalin condensates. Among these, alkyl benzenesulfonic acid salts, alkylnaphthalenesulfonic acid salts and alkyl diphenyl ether (di)sulfonic acid salts are particularly preferably used.

The cationic surfactants which may be used in a developing agent are not particularly limited, and examples thereof include conventionally-known surfactants, for example, alkyl amine salts, quaternary ammonium salts, polyoxyethylene alkylamine salts and polyethylene polyamine derivatives.

The nonionic surfactants which may be used in a developing liquid are not particularly limited, and examples thereof include polyethylene glycol surfactants such as higher alcohol ethylene oxide adducts, alkyl phenol ethylene oxide adducts, alkyl naphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, oil or fat ethylene oxide adducts, polypropylene glycol ethylene oxide adducts, dimethyl siloxane-ethylene oxide block copolymer or dimethyl siloxane-(propylene oxide-ethylene oxide)block copolymer; polyhydric alcohol surfactants such as fatty acid esters of glycerol, fatty acid esters of pentaerythritol, fatty acid esters of sorbitol and sorbitan, fatty acid esters of sucrose, alkyl ethers of polyhydric alcohol and fatty acid amides of alkanolamines. Among these, those having an aromatic ring and an ethylene oxide chain are preferred, and alkyl substituted or unsubstituted phenol ethylene oxide adducts or alkyl substituted or unsubstituted naphthol ethylene oxide adducts are more preferred.

The amphoteric surfactants which may be used in a developing liquid are not particularly limited, and examples thereof include amine oxides such as alkyl dimethyl amine oxides and betaines such as alkyl betaines, amino acids such as sodium alkylamino fatty acids. In particular, alkyl dimethyl amine oxides optionally having a substituent, alkyl carboxybetaines optionally having a substituent and alkyl sulfobetaines optionally having a substituent are preferably used. Furthermore, specific examples thereof are described in paragraphs [0255] to [0278] of JP-A No. 2008-203359, paragraphs [0028] to [0052] of JP-A No. 2008-276166, or the like.

From the viewpoint of stable solubility or turbidity to water, the HLB value is preferably 6 or higher, and more preferably 8 or higher.

Examples of the surfactant used for a developing liquid preferably include anionic surfactants and nonionic surfactants, and particularly preferably include anionic surfactants containing a sulfonic acid or sulfonate and nonionic surfactants containing an aromatic ring and an ethylene oxide chain.

The surfactants may be used alone, or in combination of two or more thereof.

The content of the surfactant contained in a developing liquid is preferably from 0.01 to 10% by weight, and more preferably from 0.01 to 5% by weight.

In order to keep the pH of the developing liquid from 6 to 13.5, a carbonate ion or a hydrogen carbonate ion is contained as a buffer agent, which is capable of preventing variation of pH even when the developing liquid is used for a long time, and the decrease in development property, the generation of a development residue and the like due to the pH variation are suppressed. In order for the developing liquid to contain a carbonate ion or a hydrogen carbonate ion, the carbonate and the hydrogen carbonate may be added to the developing agent, or the carbonate or the hydrogen carbonate may be added, then the pH is adjusted to generate a carbonate ion and a hydrogen carbonate ion. The carbonate and the hydrogen carbonate are not particularly limited, and examples thereof preferably include alkaline metal salts. Examples of the alkaline metal include lithium, sodium and potassium. Sodium is particularly preferred. These may be used alone, or two or more of these may be used in combination.

The pH of the development liquid is not particularly limited as long as the development can be carried out, and preferably in the range of from 8.5 to 10.8.

The total amount of the carbonate and hydrogen carbonate is preferably from 0.3 to 20% by weight, more preferably from 0.5 to 10% by weight, and particularly preferably from 1 to 5% by weight, with respect to the total weight of the developing liquid. When the total amount is 0.3% by weight or more, the development property and the throughput capacity are not degraded, and when the total amount is 20% by weight or less, precipitation and crystallization are hard to occur, and further, when processing the waste of the developing liquid, a gelation is hard to occur during the neutralization, which makes the waste processing easy.

In order to support the minute adjustment of the alkali concentration and the dissolution of non-image portion of the photosensitive layer, other alkali agents, for example, an organic alkali agent may be additionally used. Examples of additional alkali agents include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, pyridine and tetramethyl ammonium hydroxide. These additional alkali agents may be used alone, or two or more of these may be used in combination.

The developing liquid may further contain, other than those described above, a wetting agent, a preservative, a chelate compound, a defoaming agent, an organic acid, an organic solvent, an inorganic acid, a mineral salt, and the like. When a water-soluble polymer compound is added, the plate surface tends to become sticky especially when the developing liquid is exhausted, and therefore it is preferable a water-soluble polymer is not added.

Examples of the wetting agent suitably used in the invention include ethylene glycol, propylene glycol, triethylene glycol, butylene glycol, hexylene glycol, diethylene glycol, dipropylene glycol, glycerol, trimethylolpropane and diglycerol. The wetting agents may be used alone, or in combination of two or more thereof. The wetting agent is preferably used in an amount of from 0.1 to 5% by weight based on the total weight of the developing agent.

Examples of the preservative preferably used in the invention include phenol or derivatives thereof, formalin, imidazole derivatives, sodium dehydroacetate, 4-isothiazolin-3-one derivatives, benzisothiazolin-3-one, 2-methyl-4-isothiazolin-3-one, benztriazole derivatives, amidine guanidine derivatives, quaternary ammonium salts, pyridine, quinoline, derivatives of guanidines, diazine, triazole derivatives, oxazole, oxazine derivatives, nitrobromoalcohol-based 2-bromo-2-nitropropane-1,3diol, 1,1-dibromo-1-nitro-2-ethanol and 1,1-dibromo-1-nitro-2-propanol. In order to attain a sterilization effect on a variety of molds, a combination of two or more of preservatives may be preferably used. The amount of preservative to be added is an amount capable of exerting stable effect on bacteria, molds, yeasts or the like, and preferably, depending on the type of the bacteria, molds, yeasts or the like, in the range of from 0.01 to 4% by weight based on the total weight of the developing liquid.

Examples of the chelate compounds include ethylene diamine tetraacetic acid, potassium salts and sodium salts thereof; diethylene triamine pentaacetic acid, potassium salts and sodium salts thereof; triethylene tetramine hexaacetic acid, potassium salts and sodium salts thereof; hydroxyethyl ethylene diamine triacetic acid, potassium salts and sodium salts thereof; nitrilotriacetic acid, sodium salts thereof; 1-hydroxyethane-1,1-diphosphonic acid, potassium salts and sodium salts thereof organic phosphonic acids such as amino tri(methylene phosphonic acid), potassium salts and sodium salts thereof and phosphonoalkane tricarboxylic acids. In place of the above sodium salts or potassium salts of the chelate agent, organic amine salts of the chelate agent are also effectively used. As the chelate agent, a chelate agent that exists stably in the composition of the developing agent and does not inhibit the printing performance may be selected. The amount of chelate agents to be added is preferably from 0.001 to 1.0% by weight based on the total weight of the developing agent.

Examples of the defoaming agent include a general silicone-containing self-emulsifying, emulsifying and nonionic compounds, and, specifically, a compound having a HLB value of 5 or smaller is preferable. Silicone defoaming agents are preferred. Specifically, any of an emulsifying and dispersing type and a solubilizing type may be used. The content of the silicone defoaming agent is suitably from 0.001 to 1.0% by weight based on the total weight of the developing liquid.

Examples of the organic acids include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid and organic phosphonic acid. The organic acids in the form of alkaline metal salts or ammonium salts may be used. The content of the organic acids is preferably from 0.01 to 0.5% by weight based on the total weight of the developing liquid.

Examples of the organic solvents include aliphatic hydrocarbons (such as hexane, heptane, ISOPER E, ISOPER H, ISOPER G (trade names, manufacture by Esso Chemical Ltd.), gasoline, or kerosene), aromatic hydrocarbons (such as toluene, or xylene), halogenated hydrocarbons (such as methylene dichloride, ethylene dichloride, trichlene, or monochlorobenzene) and polar solvents.

Examples of the polar solvents include alcohols (such as methanol, ethanol, propanol, isopropanol, benzyl alcohol, ethylene glycol monomethyl ether, or 2-ethoxyethanol), ketones (such as methyl ethyl ketone, or cyclohexanone), esters (such as ethyl acetate, methyl lactate, or propylene glycol monomethyl ether acetate), and other solvents (such as triethyl phosphate, tricresyl phosphate, N-phenylethanolamine, or N-phenyldiethanolamine).

When the above-mentioned organic solvents are water-insoluble, the solvents may be used after they are made water-soluble by means of a surfactant or the like. When the developing liquid contains an organic solvent, the concentration of the solvent is preferably less than 40% by weight from the viewpoints of safety and flammability.

Examples of the inorganic acids and inorganic salts include phosphoric acid, metaphosphoric acid, monobasic ammonium phosphate, dibasic ammonium phosphate, monobasic sodium phosphate, dibasic sodium phosphate, monobasic potassium phosphate, dibasic potassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sulfuric acid hydrogen sodium and nickel sulfate. The content of inorganic salt is preferably 0.01 to 0.5% by weight based on the total weight of the developing liquid.

The temperature of the development is not particularly limited as long as the development can be carried out, and preferably 60° C. or less and more preferably in the range of 15 to 40° C. In the development treatment using an automatic developing machine, since the developing liquid may be exhausted depending on the throughput, a replenisher or a fresh developing liquid may be used to recover the throughput capacity. As one example of the development and the treatment after the development, a method in which an alkali development is carried out, the alkali is removed in a post-water washing step, a gumming process is carried out in a gumming step and drying is carried out in a drying step, is exemplified. As another example thereof, a method in which, by using an aqueous solution containing carbonate ion, hydrogen carbonate ion and a surfactant, a pre-water washing, a development and a gumming are carried out at the same time is preferably exemplified. Accordingly, the pre-washing step is not particularly carried out, and preferably, one liquid is used and further a one-bath pre-water washing and a gumming are carried out, and thereafter a drying step is carried out. After the development, it is preferred that a drying is carried out after removing a surplus developing liquid by using a squeeze roller or the like.

The development step may be suitably carried out using an automatic processing machine having at least a rubbing member. Examples of the automatic processing machine include the automatic processing machine described in JP-A No. 02-220061 and JP-A No. 60-59351, in which a rubbing treatment is carried out while a planographic printing plate precursor after image exposure is conveyed, and the automatic processing machine described in U.S. Pat. No. 5,148,746, U.S. Pat. No. 5,568,768, and GB 2297719, in which a planographic printing plate precursor after image exposure, which is arranged on a cylinder, is subjected to a rubbing treatment while the cylinder is rotated. Specifically, an automatic processing machine using a rotary brush roller as a rubbing member is particularly preferred.

The rotary brush roller used in the present invention may be selected as required depending on the scratch-resistance of the image portion and further the toughness of the support of the planographic printing plate precursor. As the rotary brush roller, any one of known rollers in which brush materials are planted on a plastic or metal roller may be used. Examples thereof include those described in JP-A No. 58-159533 and JP-A No. 03-100554, and brush rollers as described in JP-A No. 62-167253, in which a metal or plastic groove-shaped material having brush materials planted thereon in lines is rolled radially without a space on a plastic or metal roll which is a core.

As the brush materials, plastic fibers (for example, synthetic fibers made of polyesters such as polyethylene terephthalate or polybutylene terephthalate, polyamides such as nylon 6.6 or nylon 6.10, polyacryls such as polyacrylonitrile, poly(meta)alkyl acrylate, polyolefins such as polypropylene or polystyrene) may be used, and those having a diameter of fiber bristle of 20 μm to 400 μm and a length of bristle of 5 mm to 30 mm are preferably used.

The external diameter of a rotary brush roller is preferably from 30 mm to 200 mm, and the circumferential speed at the end of brush which rubs the printing plate is preferably from 0.1 to 5 m/sec. It is preferable to use plural rotary brush rollers.

The direction of rotation of rotary brush roller may be in the same direction as or opposite direction to the direction of conveyance of a planographic printing plate precursor. When two or more rotary brush rollers are used, it is preferred that at least one rotary brush roller rotates in the same direction as the direction of conveyance of a planographic printing plate precursor, and at least one rotary brush roller rotates in the opposite direction to the direction of conveyance of a planographic printing plate precursor. By this, the removal of the photosensitive layer in a non-image region is further ensured. Further, it is also effective to fluctuate the rotary brush roller in the direction of the rotation axis of the brush roller.

After the development step, it is preferable to carry out a continuous or discontinuous drying step. The drying step may be carried out by means of dry air, an infrared ray or a far-infrared ray.

As the automatic processing machine suitably used in the method for manufacturing a planographic printing plate of the present invention, an apparatus having at least a developing device and a drying device is used, in which a planographic printing plate precursor is subjected to development and gumming in a developer tank, and then dried in the drying device, whereby a planographic printing plate is obtained.

For the purpose of improving printing durability, the printing plate after the development may be subjected to heating under extremely severe conditions. The heating temperature is usually in the range of from 200 to 500° C. When the temperature is low, a sufficient effect of strengthening an image is not obtained, and when the temperature is too high, problems such as degradation of a support or thermal decomposition of an image portion may arise.

The thus-obtained planographic printing plate is placed on an offset printing machine, and is suitably used for printing a large number of sheets.

EXAMPLES

In the following, the present invention is described in detail by way of Examples, but not limited thereto. The following Examples show embodiments in which an image forming material of the invention is applied to a planographic printing plate precursor, as an example of the most suitable embodiment of the usage thereof, for example.

Synthesis Examples

Synthesis of O-10

Synthesis of N-benzyl-N-methylpiperidinium chloride

In a 200-mL three-necked flask equipped with a condenser and a stirrer, 7.63 g of N-benzyl-N-methylpiperidine and 50 mL of acetonitrile were measured and added. To this solution, 8.86 g of benzyl chloride was added dropwise over 15 minutes. The reaction solution was heated and stirred at a temperature of 70° C. for 3 hours, followed by cooling and filtration of the precipitated powder, thereby obtaining 15.6 g of N-benzyl-N-methylpiperidinium chloride. The powder was confirmed to be the desired substance by NMR spectrum, MS spectrum and IR spectrum thereof.

Synthesis of O-10 (N-benzyl-N-methylpiperidinium hydroxide)

In a 100-mL three-necked flask equipped with a condenser and a stirrer, 2.92 g of potassium hydroxide and 20 mL of methanol were weighed and added, and 10.0 g of N-benzyl-N-methylpiperidinium chloride dissolved in 23 mL of methanol was added thereto dropwise over 10 minutes. At room temperature, the mixture was stirred for 1 hour, and precipitated potassium chloride was filtrated off. To the resultant filtrate, 0.44 g of silver oxide was added, and stirred for 1 hour at room temperature. Precipitated silver chloride and unreacted silver oxide were filtrated out, thereby obtaining 43.6 g of 20% solution of N-benzyl-N-methylpiperidinium hydroxide. The solution was confirmed to be the desired substance by NMR spectrum, MS spectrum and IR spectrum thereof.

Synthesis of PN-53

Synthesis of PU-1

In a 1-L three-necked flask equipped with a condenser and a stirrer, 53.65 g of 2,2-bis(hydroxymethyl)propionic acid (manufactured by Tokyo Chemical Industry Co., Ltd.) and 591 g of N,N-dimethylacetamide were measured and added. The temperature of the reaction liquid was increased to 50° C., and an uniform solution was prepared. Then, 80.08 g of MILLIONATE MT (trade name, manufactured by Nippon Polyurethane Industry Co., Ltd.), 13.93 g of 2,4-tolylene diisocyanate (manufactured by Tokyo Chemical Industry Co., Ltd.) and 0.80 g of NEOSTAN U-600 (trade name, manufactured by NITTO KASEI CO., LTD.: bismuth catalyst) were added in this order, and reacted at a temperature of 80° C. for 4 hours. To the reaction solution, 5 g of methanol was added and quenched, thereby obtaining 20% solution of polyurethane (PU-1). The reaction solution was added to 1.5 L of water to precipitate polyurethane. The precipitate was filtrated, washed and dried, thereby obtaining a binder polymer (PU-1). The desired substance was confirmed by measuring NMR spectrum, IR spectrum and GPC (in terms of polystyrene) thereof.

Synthesis of PN-53

To 40 g of 20% solution of the thus-obtained polymer (PU-1), 5.77 g of 20% solution of the thus-obtained (O-10) was added and stirred at room temperature for 1 hour. The obtained solution was added to 500 mL of water to precipitate polyurethane. The polyurethane was filtrated, washed and dried, thereby obtaining a binder polymer (PN-53). The desired substance was confirmed by measuring NMR spectrum, IR spectrum and GPC (in terms of polystyrene) thereof.

Examples 1 to 36 and Comparative Examples 1 to 5

Production of Support

The surface of an aluminum plate (according to JIS A1050) having a thickness of 0.3 mm was subjected to roughening using a rotary nylon brush with a pumice-water suspension as an abrasive. The surface roughness (center-line-average roughness) thereof was 0.5 μm. After washing with water, the aluminum plate was immersed in a solution which was a 10% aqueous caustic soda solution heated at a temperature of 70° C. and etched such that the amount of dissolved aluminum was 6 $g/m^3$. After washing with water, the aluminum plate was immersed in a 30% nitric acid aqueous solution for 1 minute for neutralization, and washed with water sufficiently. Thereafter, the aluminum plate was subjected to electrolytic roughening in a 0.7% nitric acid aqueous solution for 20 seconds using a rectangular, alternating wave voltage of an anode voltage of 13 volts and a cathode voltage of 6 volts, and the surface of the aluminum plate was washed by immersing it in a 20% sulfuric acid solution having a temperature of 50° C., followed by washing with water. On the roughened aluminum sheet, porous anode oxidation film formation treatment was carried out in a 20% sulfuric acid aqueous solution using a direct current. A substrate having on the surface an anodic oxidation coating having a weight of 4.0 $g/m^2$ was manufactured by carrying out an electrolysis at a current density of 5 $A/dm^2$ while adjusting an electrolysis time. This substrate was treated in a saturated steam chamber at a temperature of 100° C. at 1 atmosphere to manufacture (a) a substrate having pores at a sealing ration of 60%. The surface of the (A) substrate was hydrophilized by treating with a 2.5 wt % sodium silicate solution at a temperature of 30° C. for 10 seconds, thereby obtaining a [A] planographic printing plate support. The amount of coating film after drying was 15 $mg/m^2$.

Formation of Undercoat Layer

On the support [A] prepared in the above-described manner, an undercoat solution 1 described below was applied, and dried at a temperature of 80° C. for 15 seconds, to provide an undercoated layer, thereby obtaining a support [C]. The amount of coating film after drying was 15 $mg/m^2$.

[Undercoat Solution 1]

| | |
|---|---|
| Copolymer having a molecular weight of 28,000: | 0.3 g |
| Methanol: | 100 g |
| Water: | 1 g |

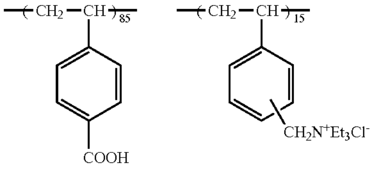

Molecular weight = 28,000

Formation of Lower Layer

On the thus-obtained undercoated support [C], a coating liquid composition (I) for forming a lower layer having the composition described below was applied using a wire bar coater and then dried in a drying oven at a temperature of 150° C. for 40 seconds such that the amount of the coated composition became 1.3 $g/m^2$, thereby forming a lower layer. After the lower layer had been provided, a coating liquid composition (II) for forming an upper layer having the composition described below was applied using a wire bar coater, thereby forming an upper layer. After the coating, a drying process was carried out at a temperature of 150° C. for 40 seconds, thereby obtaining a photosensitive planographic printing plate precursor for an infrared laser, in which the total amount of the applied compositions of the lower layer and the upper layer was 1.7 $g/m^2$.

(Coating Liquid Composition (I) for Forming Lower Layer)

| | |
|---|---|
| Polymer shown in Table 1: | 3.5 g |
| Monovalent basic compound or comparative basic compound shown in Table 1: (The amount shown in Table 1: g) | |
| Infrared absorbing agent (IR colorant (1) having a structure shown below): | 0.2 g |
| Dye obtained by changing the counter anion of ethyl violet to 6-hydroxy-β-naphthalene sulfonic acid: | 0.15 g |
| Bisphenol sulfone: | 0.3 g |
| Tetrahydrophthalic acid: | 0.4 g |
| Fluorine-containing surfactant (MEGAFACE F-780, trade name, manufactured by DAINIPPON INK AND CHEMICALS Inc.): | 0.02 g |
| Methyl ethyl ketone: | 30 g |
| Propylene glycol monomethyl ether: | 15 g |
| γ-Butyrolactone: | 15 g |

IR colorant (1)

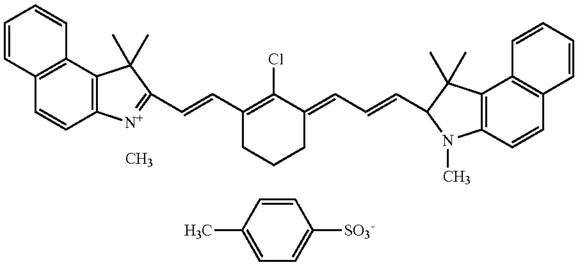

The comparative basic compound used in Comparative Example 5 was a multifunctional amine compound having the structure shown below, which is denoted as "Comparative compound D" in Table 1.

Comparative compound D

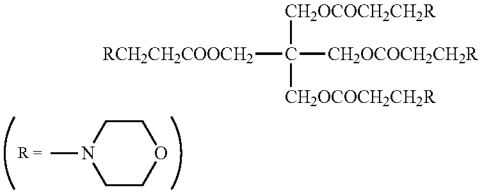

(Coating Liquid Composition (II) for Forming Upper Layer)

| | |
|---|---|
| Novolac resin (m-cresol/p-cresol/phenol = 3/2/5, Mw 8,000): | 0.68 g |
| Infrared absorbing agent (IR colorant (1): structure shown above): | 0.045 g |
| Fluorine-containing surfactant (MEGAFACE F-780, manufactured by DAINIPPON INK AND CHEMICALS Inc.): | 0.03 g |
| Methyl ethyl ketone: | 15.0 g |
| 1-Methoxy-2-propanol: | 30.0 g |

By using the obtained planographic printing plate precursor, the following evaluations were carried out. The results are shown in Table 1.

Evaluation of Unexposed Region Retention Time

The obtained planographic printing plate precursor was immersed in a developing bath fed with a developing liquid DT-2 (trade name, manufactured by FUJIFILM Corporation) which was diluted to have an electric conductivity of 43 mS/cm, for various time periods. The immersing time period until the image density of the precursor became 95% as compared with the image density of the precursor which was not immersed was defined as a retention time of an unexposed region.

Developing Time of Exposed Region

On the planographic printing plate precursor, images of a test pattern were printed using TRENDSETTER (trade name, manufactured by Creo) with various exposure energies. Thereafter, the precursor was immersed in a developing bath fed with a developing liquid DT-2 (trade name, manufactured by FUJIFILM Corporation) which was diluted to have an electric conductivity of 43 mS/cm, for various time periods. The immersing time period until the image density of the precursor became substantially the same as the image density of the Al support was defined as a developing time of an exposed region.

Evaluation of Development Latitude

On the obtained planographic printing plate precursor, an image of a test pattern was printed using TRENDSETTER (trade name, manufactured by Creo) at a beam intensity of 9 W and a drum rotation speed of 150 rpm. Thereafter, development was carried out for a development time of 22 seconds, using PS PROCESSOR 900H (trade name, manufactured by FUJIFILM Corporation) fed with solutions of an alkaline developing liquid (having the formulation described below) which had different electric conductivities achieved by changing the dilution ratio of the alkaline developing liquid by changing the amount of water, while keeping the solution temperature at 30° C. In this case, the difference between the highest and the lowest electric conductivities of solutions of developing liquid which enabled an excellent development without eluting the image region and without having a stain or coloring caused by a film residue of the photosensitive layer which was poorly developed, was evaluated as a development latitude. The results are shown in Table 1.

Evaluation of Printing Durability

On the planographic printing plate precursor, an image of a test pattern was printed using TRENDSETTER (trade name, manufactured by Creo) at a beam intensity of 9 W and a drum rotating speed of 150 rpm. Thereafter, development was carried out at a liquid temperature of 30° C. for a development time of 12 seconds using PS PROCESSOR LP940H (trade name, manufactured by FUJIFILM Corporation) fed with a developing liquid DT-2 (trade name, manufactured by FUJIFILM Corporation) which was diluted to have an electric conductivity of 43 mS/cm. The obtained planographic printing plate was used for continuous printing using a printer LITHRONE (trade name, manufactured by KOMORI Corporation). In this case, the printing durability was evaluated by measuring, by visual inspection, the number of sheets capable of being printed with a sufficient amount of ink density. The printing durability was indicated by a relative value taking the number of sheets capable of being printed with a sufficient amount of ink density in Comparative Example 1 as 1.0.

Evaluation of Printing Durability after Burning Treatment

The surface of the planographic printing plate obtained by development in the same manner as in the "evaluation of printing durability" described above was washed with water. Subsequently, the surface was wiped with a surface-controlling liquid BC-7 for burning (trade name, manufactured by FUJIFILM Corporation), followed by a burning treatment at a temperature of about 270° C. for two minutes. Thereafter, the surface was washed with water and treated with a solution prepared by diluting a gum FP-2W (trade name, manufactured FUJIFILM Corporation) 2-fold in volume with water. Thereafter, in the same manner as in the "evaluation of printing durability" described above, the printing durability after the burning treatment was evaluated in accordance with the number of sheets printed using a LITHRONE printing machine (trade name, manufactured by KOMORI Corporation) with a DIC-GEOS(N) Sumi ink (trade name, manufactured by DAINIPPON INK AND CHEMICALS) until it was confirmed by visual inspection that the density of solid image started to become thin. The printing durability was indicated by a relative value taking the number of sheets capable of being printed with a sufficient amount of ink density in Comparative Example 1 as 1.0.

Evaluation of Development Residue (Scum)

The planographic printing plate obtained in the same manner as in the above-mentioned "evaluation of developing time of exposed region" by being immersed in a developing liquid for 12 seconds was further immersed in a developing bath fed with distilled water for 20 seconds, and the surface thereof was observed by visual inspection. The evaluation criteria were defined as follows:

"A": there was no residue adhered on the surface, and no residue floated in the developing bath;

"B": there was no residue adhered on the surface, but minute development residues were observed in the developing bath;

"C": there was no residue adhered on the surface, but large development residues were observed in the developing bath; and "D": coloring component (i.e., development scum) was clearly adhered on the surface.

Evaluation of Chemical Resistance

A planographic printing plate precursor of Examples was subjected to light exposure, development and printing in the same manner as in the above-described "evaluation of printing durability", except that a step of wiping the surface of the plate with a cleaner (MULTI CLEANER, trade name, manufactured by FUJIFILM Corporation) were added every times after 5,000 sheets were printed, and the chemical resistance were evaluated. The evaluation criteria of the printing durability in this case were defined as follows:

"A": the number of sheets printed with a sufficient ink concentration was from 95% to 100% of that in the "evaluation of printing durability";

"B": the number of sheets printed with a sufficient ink concentration was from 80% to 95% of that in the "evaluation of printing durability";

"C": the number of sheets printed with a sufficient ink concentration was from 60% to 80% of that in the "evaluation of printing durability"; and "D": the number of sheets printed with a sufficient ink concentration was less than 60% of that in the "evaluation of printing durability".

Its should be noted that even when a step of wiping the surface of the plate with a cleaner is added, it is estimated that the smaller the change in printing durability index is, the better the chemical resistance is.

Developing Time of Exposed Region after Forced Aging

The obtained planographic printing plate precursor was forcedly left to stand in a thermostatic chamber at a temperature of 50° C. for 8 hours, and then an evaluation of developing time of an exposed region was, carried out in the same manner as in the above-mentioned "evaluation of developing time of exposed region".

Development Liquid

| | |
|---|---|
| D-sorbitol: | 2.5% by mass |
| Sodium hydroxide: | 0.85% by mass |
| Nonionic surfactant: polyethylene glycol lauryl ether (weight-average molecular weight = 1,000): | 0.5% by mass |
| Water: | 96.15% by mass |

TABLE 1

| | Lower layer formulation | | | Evaluation results | | | | | | | |
|---|---|---|---|---|---|---|---|---|---|---|---|
| | (A-1) Binder polymer | (A-2) Monovalent basic compound | (A-2) Addition amount (g) | Non-exposed region retention time (sec) | Exposed region development time (sec) | Development latitude (mS/cm) | Printing durability | Printing durability after burning | Development scum | Chemical resistance | Exposed region development time after forced aging (sec) |
| Example 1 | PU-1 | B-5 | 0.37 | 29 | 11 | 13 | 1.4 | 1.7 | B | B | 11 |
| Example 2 | PU-1 | B-8 | 0.37 | 27 | 9 | 13 | 1.4 | 1.7 | B | B | 9 |
| Example 3 | PU-1 | B-11 | 0.37 | 29 | 11 | 13 | 1.4 | 1.7 | B | B | 11 |
| Example 4 | PU-1 | B-12 | 0.37 | 28 | 10 | 13 | 1.4 | 1.7 | B | B | 10 |
| Example 5 | PU-1 | B-17 | 0.37 | 29 | 11 | 13 | 1.4 | 1.7 | B | B | 11 |
| Example 6 | PU-1 | B-19 | 0.37 | 30 | 12 | 13 | 1.4 | 1.7 | B | B | 12 |
| Example 7 | PU-1 | B-31 | 0.37 | 24 | 9 | 10 | 1.4 | 1.7 | B | B | 9 |
| Example 8 | PU-1 | B-38 | 0.37 | 34 | 10 | 14 | 1.4 | 1.7 | B | B | 10 |
| Example 9 | PU-1 | B-39 | 0.37 | 24 | 10 | 10 | 1.3 | 1.6 | B | B | 10 |
| Example 10 | PU-1 | B-42 | 0.37 | 24 | 10 | 10 | 1.3 | 1.6 | B | B | 10 |
| Example 11 | PA-1 | B-46 | 0.37 | 29 | 11 | 11 | 1.0 | 1.3 | A | B | 11 |
| Example 12 | PA-3 | B-46 | 0.37 | 29 | 11 | 11 | 1.1 | 1.4 | A | B | 11 |
| Example 13 | PA-4 | B-46 | 0.37 | 31 | 13 | 13 | 1.1 | 1.4 | A | B | 13 |
| Example 14 | PA-9 | B-46 | 0.37 | 32 | 11 | 11 | 1.1 | 1.4 | A | B | 11 |
| Example 15 | PA-10 | B-46 | 0.37 | 32 | 11 | 11 | 1.2 | 1.5 | A | B | 11 |
| Example 16 | PB-1 | B-46 | 0.37 | 29 | 11 | 11 | 1.3 | 1.6 | A | B | 11 |
| Example 17 | PB-4 | B-46 | 0.37 | 32 | 10 | 10 | 1.3 | 1.6 | A | B | 10 |
| Example 18 | PU-1 | B-46 | 0.17 | 24 | 9 | 9 | 1.6 | 1.9 | B | B | 9 |
| Example 19 | PU-1 | B-46 | 0.37 | 32 | 9 | 9 | 1.6 | 1.9 | B | B | 9 |
| Example 20 | PU-1 | B-46 | 0.74 | 34 | 9 | 9 | 1.3 | 1.6 | B | B | 9 |
| Example 21 | PU-1 | B-46 | 1.11 | 35 | 9 | 9 | 1.2 | 1.5 | B | B | 9 |
| Example 22 | PU-3 | B-46 | 0.37 | 35 | 9 | 9 | 1.4 | 1.7 | B | B | 9 |
| Example 23 | PU-9 | B-46 | 0.37 | 35 | 9 | 9 | 1.7 | 2.0 | B | B | 9 |
| Example 24 | PU-11 | B-46 | 0.37 | 35 | 9 | 9 | 1.5 | 1.8 | B | B | 9 |
| Example 25 | PU-19 | B-46 | 0.37 | 29 | 11 | 11 | 1.5 | 1.8 | B | B | 11 |
| Example 26 | PU-20 | B-46 | 0.37 | 30 | 12 | 12 | 1.5 | 1.8 | B | B | 12 |
| Example 27 | PU-21 | B-46 | 0.37 | 29 | 11 | 11 | 1.5 | 1.8 | B | B | 11 |
| Example 28 | PU-22 | B-46 | 0.37 | 29 | 11 | 11 | 1.4 | 1.7 | A | B | 11 |
| Example 29 | PU-23 | B-46 | 0.37 | 29 | 11 | 11 | 1.4 | 1.7 | A | B | 11 |
| Example 30 | PU-25 | B-46 | 0.37 | 32 | 9 | 9 | 1.6 | 1.9 | A | A | 9 |
| Example 31 | PU-26 | B-46 | 0.37 | 32 | 9 | 9 | 1.6 | 1.9 | A | A | 9 |
| Example 32 | PU-27 | B-46 | 0.37 | 32 | 9 | 9 | 1.6 | 1.9 | A | A | 9 |
| Example 33 | PU-28 | B-46 | 0.37 | 32 | 9 | 9 | 1.6 | 1.9 | A | A | 9 |
| Example 34 | PU-31 | B-46 | 0.37 | 29 | 11 | 11 | 1.4 | 1.7 | B | B | 11 |
| Example 35 | PU-32 | B-46 | 0.37 | 29 | 11 | 11 | 1.4 | 1.7 | A | A | 11 |
| Example 36 | PU-33 | B-46 | 0.37 | 29 | 11 | 11 | 1.4 | 1.7 | A | A | 11 |
| Comparative Example 1 | PA-1 | none | — | 0 | 9 | 9 | 1.0 | 1.3 | A | C | 16 |
| Comparative Example 2 | PB-1 | none | — | 0 | 11 | 11 | 1.2 | 1.5 | A | C | 18 |
| Comparative Example 3 | PU-1 | none | — | 0 | 9 | 9 | 1.5 | 1.8 | B | D | 16 |
| Comparative Example 4 | REF-1 | none | — | 29 | 9 | 9 | 1.0 | 1.3 | A | A | 11 |
| Comparative Example 5 | PU-1 | Comparative compound D | 0.37 | 32 | 28 | 28 | 1.5 | 1.8 | D | A | 25 |

As is apparent from Table 1, it is found that, when a polymer having carboxylic acid groups of the present invention and a monovalent basic compound capable of neutralizing the carboxylic acid groups are used, solubility discrimination (i.e., the difference between the retention time of an unexposed region and developing time of an exposed region), development latitude and chemical resistance are improved while retaining the printing durability and development residue. The result of Comparative Example 5 in which a polyvalent basic compound is used, shows that, even when a basic compound is used, the development property is poor and the generation of a development residue is recognized although the strength of image region and chemical resistance are excellent.

Examples 37 to 72 and Comparative Examples 6 to 9

Production of Support

A support [A] was prepared in the same manner as in Example 1.

Formation of Undercoat Layer

A support [C] having an undercoat layer was manufactured in the same manner as in Example 1.

Formation of Recording Layer

On the obtained undercoated support, a coating liquid composition (III) for forming a lower layer having the formulation described below was applied using a wire bar coater, and then dried in a drying oven at a temperature of 150° C. for 40 seconds such that the amount of the coated composition became 1.3 g/$m^2$, thereby forming a lower layer. After the lower layer had been provided, a coating liquid composition (IV) for forming an upper layer having the formulation described below was applied using a wire bar coater, thereby forming an upper layer. After the coating, a drying process was carried out at a temperature of 150° C. for 40 seconds, thereby obtaining a photosensitive planographic printing plate precursor for an infrared laser, in which the total amount of the coated compositions of the lower layer and the upper layer was 1.7 g/$m^2$.

(Coating Liquid Composition (III) for Forming Lower Layer)

| | |
|---|---|
| Polymer shown in Table 2: | 3.5 g |
| Dye obtained by changing the counter anion of ethyl violet to 6-hydroxy-β-naphthalene sulfonic acid: | 0.15 g |
| m,p-Cresol novolac (m/p ratio = 6/4, weight-average molecular weight 6000): | 0.6 g |

-continued

| | |
|---|---|
| Infrared absorbing agent (IR colorant (1) having structure shown above): | 0.25 g |
| Bisphenol sulfone: | 0.3 g |
| Tetrahydrophthalic acid: | 0.4 g |
| Fluorine-containing surfactant (MEGAFACE F-780, manufactured by DAINIPPON INK AND CHEMICALS Inc.): | 0.02 g |
| Methyl ethyl ketone: | 30 g |
| Propylene glycol monomethyl ether: | 15 g |
| γ-Butyrolactone: | 15 g |

(Coating Liquid Composition (IV) for Forming Upper Layer)

| | |
|---|---|
| Novolac resin (m-cresol/p-cresol/phenol = 3/2/5, Mw 8,000): | 0.68 g |
| Infrared absorbing agent (IR colorant (1) having structure shown above): | 0.045 g |
| Fluorine-containing surfactant (MEGAFACE F-780, manufactured by DAINIPPON INK AND CHEMICALS Inc.): | 0.03 g |
| Methyl ethyl ketone: | 15.0 g |
| 1-Methoxy-2-propanol: | 30.0 g |

The obtained planographic printing plate precursors were each evaluated in the same manner as in Example 1. The results thereof are shown in Table 2.

TABLE 2

| | (A) Binder polymer | Non-exposed region retention time (sec) | Exposed region development time (sec) | Development latitude (mS/cm) | Printing durability | Printing durability after burning | Development scum | Chemical resistance | Exposed region development time after forced aging (sec) |
|---|---|---|---|---|---|---|---|---|---|
| Example 37 | PN-1 | 30 | 12 | 13 | 1.4 | 1.7 | B | B | 12 |
| Example 38 | PN-2 | 28 | 10 | 13 | 1.4 | 1.7 | B | B | 10 |
| Example 39 | PN-3 | 30 | 12 | 13 | 1.4 | 1.7 | B | B | 12 |
| Example 40 | PN-4 | 29 | 11 | 13 | 1.4 | 1.7 | B | B | 11 |
| Example 41 | PN-5 | 30 | 12 | 13 | 1.4 | 1.7 | B | B | 12 |
| Example 42 | PN-6 | 31 | 13 | 13 | 1.4 | 1.7 | B | B | 13 |
| Example 43 | PN-8 | 25 | 10 | 10 | 1.4 | 1.7 | B | B | 10 |
| Example 44 | PN-9 | 35 | 11 | 14 | 1.4 | 1.7 | B | B | 11 |
| Example 45 | PN-10 | 25 | 11 | 10 | 1.3 | 1.6 | B | B | 11 |
| Example 46 | PN-11 | 25 | 11 | 10 | 1.3 | 1.6 | B | B | 11 |
| Example 47 | PN-12 | 30 | 12 | 12 | 1.0 | 1.3 | A | B | 12 |
| Example 48 | PN-13 | 30 | 12 | 12 | 1.1 | 1.4 | A | B | 12 |
| Example 49 | PN-14 | 32 | 14 | 12 | 1.1 | 1.4 | A | B | 14 |
| Example 50 | PN-15 | 33 | 12 | 12 | 1.1 | 1.4 | A | B | 12 |
| Example 51 | PN-16 | 33 | 12 | 12 | 1.2 | 1.5 | A | B | 12 |
| Example 52 | PN-17 | 30 | 12 | 12 | 1.3 | 1.6 | A | B | 12 |
| Example 53 | PN-18 | 33 | 11 | 12 | 1.3 | 1.6 | A | B | 11 |
| Example 54 | PN-19 | 25 | 10 | 13 | 1.6 | 1.9 | B | B | 10 |
| Example 55 | PN-20 | 33 | 10 | 13 | 1.6 | 1.9 | B | B | 10 |
| Example 56 | PN-21 | 35 | 10 | 13 | 1.3 | 1.6 | B | B | 10 |
| Example 57 | PN-22 | 36 | 10 | 13 | 1.2 | 1.5 | B | B | 10 |
| Example 58 | PN-23 | 36 | 10 | 13 | 1.4 | 1.7 | B | B | 10 |
| Example 59 | PN-24 | 36 | 10 | 13 | 1.7 | 2.0 | B | B | 10 |
| Example 60 | PN-25 | 36 | 10 | 13 | 1.5 | 1.8 | B | B | 10 |
| Example 61 | PN-26 | 30 | 12 | 12 | 1.5 | 1.8 | B | B | 12 |
| Example 62 | PN-27 | 31 | 13 | 12 | 1.5 | 1.8 | B | B | 13 |
| Example 63 | PN-28 | 30 | 12 | 12 | 1.5 | 1.8 | B | B | 12 |
| Example 64 | PN-29 | 30 | 12 | 12 | 1.4 | 1.7 | A | B | 12 |
| Example 65 | PN-30 | 30 | 12 | 12 | 1.4 | 1.7 | A | B | 12 |
| Example 66 | PN-31 | 33 | 10 | 13 | 1.6 | 1.9 | A | A | 10 |
| Example 67 | PN-32 | 33 | 10 | 13 | 1.6 | 1.9 | A | A | 10 |
| Example 68 | PN-33 | 33 | 10 | 13 | 1.6 | 1.9 | A | A | 10 |
| Example 69 | PN-34 | 33 | 10 | 13 | 1.6 | 1.9 | A | A | 10 |
| Example 70 | PN-35 | 30 | 12 | 12 | 1.4 | 1.7 | B | B | 12 |

TABLE 2-continued

| | (A) Binder polymer | Non-exposed region retention time (sec) | Exposed region development time (sec) | Development latitude (mS/cm) | Printing durability | Printing durability after burning | Development scum | Chemical resistance | Exposed region development time after forced aging (sec) |
|---|---|---|---|---|---|---|---|---|---|
| Example 71 | PN-36 | 30 | 12 | 12 | 1.4 | 1.7 | A | A | 12 |
| Example 72 | PN-37 | 30 | 12 | 12 | 1.4 | 1.7 | A | A | 12 |
| Com. Ex. 6 | PA-1 | 0 | 10 | 10 | 1.0 | 1.3 | A | C | 17 |
| Com. Ex. 7 | PB-1 | 0 | 12 | 12 | 1.2 | 1.5 | A | C | 19 |
| Com. Ex. 8 | PU-2 | 0 | 10 | 10 | 1.5 | 1.8 | B | D | 17 |
| Com. Ex. 9 | REF-1 | 30 | 10 | 10 | 1.0 | 1.3 | A | A | 11 |

As is apparent from Table 2, it is found that, when a polymer having a salt structure formed from a monovalent basic compound and a carboxylic acid group of the present invention is used in a lower layer, solubility discrimination (i.e., the difference between the retention time of an unexposed region and developing time of an exposed region), development latitude and chemical resistance are improved.

Examples 73 to 92, 100 to 103, and 107 to 122 and Comparative Examples 10 to 12

A support, an undercoat intermediate layer and a recording layer were produced in the same manner as in Example 1, except that the polymers and the monovalent basic compounds or comparative basic compounds shown in Tables 3-1 and 3-2 were used instead of the polymers shown in Table 1 and the monovalent basic compounds or comparative basic compounds shown in Table 1, respectively, and planographic printing plate precursors of Examples 73 to 92, 100 to 103, and 107 to 122 and Comparative Examples 10 to 12 were obtained.

The obtained planographic printing plate precursors of Examples 73 to 92, 100 to 103, and 107 to 122 and Comparative Examples 10 to 12 were evaluated as described below.

The monovalent basic compounds shown in Table 3-2 are provided as a methanol solution or an aqueous solution, but the amounts thereof shown in Table 3-2 were based on solid content.

Evaluation of Retention Time of Unexposed Region

Evaluation of retention time of an unexposed region was carried out in the same manner as in Example 1, except that a developing liquid 2 described below was used as a developing liquid.

Developing Time of Exposed Region

Evaluation of developing time of an exposed region was carried out in the same manner as in Example 1, except that a developing liquid 2 described below was used as a developing liquid.

Evaluation of Development Latitude

Evaluation of development latitude was carried out in the same manner as in Example 1, except that a developing liquid 2 described below was used as a developing liquid and a development was carried out in a development step described below.

Evaluation of Printing Durability

Evaluation of printing durability was carried out in the same manner as in Example 1, except that a developing liquid 2 described below was used as a developing liquid and a development was carried out in a development step described below.

Evaluation of Printing Durability after Burning Treatment

Evaluation of the printing durability after a burning treatment was carried out in the same manner as in Example 1, except that a developing liquid 2 described below was used as a developing liquid and a development was carried out by a development step described below.

Evaluation of Development Residue

Evaluation of development residue was carried out in the same manner as in Example 1, except that a developing liquid 2 described below was used as a developing liquid.

Evaluation of Chemical Resistance

Evaluation of chemical resistance was carried out in the same manner as in Example 1, except that a developing liquid 2 described below was used as a developing liquid and a development was carried out by a development step described below.

Developing Time of Exposed Region after Forced Aging

Evaluation of developing time of an exposed region was carried out in the same manner as in Example 1, except that a developing liquid 2 described below was used as a developing liquid.

Development Step

After light exposure, the planographic printing plate precursor was subjected to development using a developing liquid described below at a temperature of 30° C. and an automatic development processing machine (developer tank: 25 L; plate conveying speed: 100 cm/min, one brush roller having polybutylene terephthalate fibers (diameter of bristle: 200 μm, length of bristle: 17 mm, external diameter of the roller on which the bristles are planted: 50 mm) that rotates in the same direction as the direction of conveyance of the planographic printing plate precursor at a speed of 200 rpm; the circumferential speed at the end of the brush: 0.52 m/sec; drying temperature: 80° C.).

[Developing Liquid 2]

| | |
|---|---|
| Water: | 8963.8 g |
| Sodium carbonate: | 200 g |
| Sodium hydrogen carbonate: | 100 g |
| Anionic surfactant: NEWCOL B4SN (trade name, polyoxyethylene naphthyl ether sulfuric acid salt, manufactured by Nippon Nyukazai Co., Ltd.): | 300 g |
| EDTA 4Na: | 80 g |
| 2-Bromo-2-nitropropanediol: | 0.1 g |
| 2-Methyl-4-isothiazolin-3-one (pH = 9.7): | 0.1 g |

The results are shown in Tables 3-1 and 3-2.

TABLE 3-1

| | Lower layer formulation | | | Evaluation results | | | | | | | |
|---|---|---|---|---|---|---|---|---|---|---|---|
| | (A-1) Binder polymer | (A-2) Monovalent basic compound | (A-2) Addition amount (g) | Non-exposed region retention time (sec) | Exposed region development time (sec) | Deve-lopment latitude (mS/cm) | Printing durability | Printing durability after burning | Deve-lopment scum | Chemical resistance | Exposed region development time after forced aging (sec) |
| Example 73 | PU-1 | B-5 | 0.37 | 28 | 10 | 9 | 1.4 | 1.7 | B | B | 10 |
| Example 74 | PU-1 | B-8 | 0.37 | 26 | 8 | 9 | 1.4 | 1.7 | B | B | 8 |
| Example 75 | PU-1 | B-11 | 0.37 | 28 | 10 | 9 | 1.4 | 1.7 | B | B | 10 |
| Example 76 | PU-1 | B-12 | 0.37 | 27 | 9 | 9 | 1.4 | 1.7 | B | B | 9 |
| Example 77 | PU-1 | B-17 | 0.37 | 28 | 10 | 9 | 1.4 | 1.7 | B | B | 10 |
| Example 78 | PU-1 | B-19 | 0.37 | 29 | 11 | 9 | 1.4 | 1.7 | B | B | 11 |
| Example 79 | PU-1 | B-31 | 0.37 | 23 | 8 | 6 | 1.4 | 1.7 | B | B | 8 |
| Example 80 | PU-1 | B-38 | 0.37 | 32 | 9 | 10 | 1.4 | 1.7 | B | B | 9 |
| Example 81 | PU-1 | B-39 | 0.37 | 23 | 9 | 6 | 1.3 | 1.6 | B | B | 9 |
| Example 82 | PU-1 | B-46 | 0.37 | 30 | 8 | 10 | 1.5 | 1.8 | B | B | 8 |
| Example 83 | PA-2 | B-46 | 0.37 | 28 | 10 | 8 | 1.0 | 1.3 | A | B | 10 |
| Example 84 | PA-5 | B-46 | 0.37 | 28 | 10 | 8 | 1.1 | 1.4 | A | B | 10 |
| Example 85 | PA-6 | B-46 | 0.37 | 30 | 9 | 8 | 1.1 | 1.4 | A | B | 9 |
| Example 86 | PA-7 | B-46 | 0.37 | 31 | 9 | 8 | 1.1 | 1.4 | A | B | 9 |
| Example 87 | PA-8 | B-46 | 0.37 | 31 | 9 | 8 | 1.2 | 1.5 | A | B | 9 |
| Example 88 | PB-2 | B-46 | 0.37 | 26 | 8 | 8 | 1.3 | 1.6 | A | B | 8 |
| Example 89 | PB-3 | B-46 | 0.37 | 31 | 9 | 8 | 1.3 | 1.6 | A | B | 9 |
| Example 90 | PU-2 | B-46 | 0.37 | 30 | 8 | 10 | 1.5 | 1.8 | B | B | 8 |
| Example 91 | PU-4 | B-46 | 0.37 | 30 | 8 | 10 | 1.5 | 1.8 | B | B | 8 |
| Example 92 | PU-5 | B-46 | 0.37 | 30 | 8 | 10 | 1.5 | 1.8 | B | B | 8 |
| Example 100 | PU-12 | B-46 | 0.37 | 28 | 8 | 12 | 1.5 | 1.8 | B | B | 8 |
| Example 101 | PU-13 | B-46 | 0.37 | 28 | 8 | 12 | 1.5 | 1.8 | B | B | 8 |
| Example 102 | PU-14 | B-46 | 0.37 | 30 | 8 | 12 | 1.7 | 2.0 | B | B | 8 |
| Example 103 | PU-15 | B-46 | 0.37 | 30 | 8 | 12 | 1.7 | 2.0 | B | B | 8 |
| Example 107 | PU-24 | B-46 | 0.37 | 31 | 9 | 8 | 1.4 | 1.7 | A | B | 9 |
| Example 108 | PU-28 | B-46 | 0.37 | 32 | 9 | 12 | 1.4 | 1.7 | A | A | 9 |
| Example 109 | PU-29 | B-46 | 0.37 | 32 | 9 | 12 | 1.4 | 1.7 | A | A | 9 |
| Example 110 | PU-30 | B-46 | 0.37 | 32 | 9 | 12 | 1.4 | 1.7 | A | A | 9 |
| Example 111 | PU-34 | B-46 | 0.37 | 32 | 9 | 12 | 1.5 | 1.8 | A | A | 9 |
| Example 112 | PU-35 | B-46 | 0.37 | 32 | 9 | 12 | 1.2 | 1.5 | A | B | 9 |
| Comparative Example 10 | PA-1 | none | — | 0 | 8 | — | 1.0 | 1.0 | A | C | 13 |
| Comparative Example 11 | PB-1 | none | — | 0 | 10 | — | 1.1 | 1.1 | A | C | 15 |
| Comparative Example 12 | PU-1 | none | — | 0 | 8 | — | 1.4 | 1.4 | B | D | 13 |

TABLE 3-2

| | Binder polymer | Monovalent basic compound | Addition amount (g) | Non-exposed region retention time (sec) | Exposed region development time (sec) | Deve-lopment latitude (mS/cm) | Printing durability | Printing durability after burning | Deve-lopment scum | Chemical resistance | Exposed region development time after forced aging (sec) |
|---|---|---|---|---|---|---|---|---|---|---|---|
| Example 113 | PU-1 | (O-2) | 0.37 | 33 | 9 | 13 | 1.6 | 1.9 | A | B | 9 |
| Example 114 | PU-1 | (O-9) | 0.37 | 40 | 9 | 13 | 1.6 | 1.9 | A | B | 9 |
| Example 115 | PU-1 | (O-10) | 0.37 | 44 | 9 | 13 | 1.6 | 1.9 | A | B | 9 |
| Example 116 | PU-1 | (O-11) | 0.37 | 42 | 10 | 13 | 1.6 | 1.9 | A | B | 9 |
| Example 117 | PU-1 | (O-13) | 0.37 | 32 | 10 | 13 | 1.6 | 1.9 | B | B | 10 |
| Example 118 | PU-1 | (O-15) | 0.37 | 40 | 9 | 13 | 1.6 | 1.9 | A | B | 9 |
| Example 119 | PU-1 | (O-19) | 0.37 | 20 | 10 | 13 | 1.6 | 1.9 | B | B | 10 |
| Example 120 | PA-10 | (O-2) | 0.37 | 32 | 11 | 12 | 1.2 | 1.5 | A | B | 11 |
| Example 121 | PU-28 | (O-2) | 0.37 | 33 | 9 | 13 | 1.6 | 1.9 | A | A | 9 |
| Example 122 | PU-28 | (O-10) | 0.37 | 44 | 9 | 13 | 1.6 | 1.9 | A | A | 9 |

As is apparent from Tables 3-1 and 3-2, it is found that, when a polymer having, in a molecule thereof, a salt structure formed from a monovalent basic compound and a carboxylic acid group of the present invention is used in a lower layer, even when development conditions such as a formulation of the developing liquid were changed, solubility discrimination (i.e., the difference between the retention time of an unexposed region and developing time of an exposed region), development latitude and chemical resistance are improved while retaining the printing durability and suppressing development residue.

Examples 123 to 149 and Comparative Examples 13 to 15

A support, undercoat intermediate layer and recording layer were produced in the same manner as in Example 37, except that compounds shown in Tables 4 and 5 were used as a (A) binder polymer having a salt structure in a molecule thereof, and planographic printing plate precursors of Examples 123 to 149 and Comparative Examples 13 to 15 were produced. The planographic printing plate precursors were each subjected to evaluation under the same conditions as in Tables 3-1 and 3-2, except that a developing liquid 3 was used as a developing liquid. The results are shown in Tables 4 and 5.

[Developing Liquid 3]

| | |
|---|---|
| Water: | 8963.8 g |
| Sodium carbonate: | 200 g |
| Sodium hydrogen carbonate: | 100 g |
| NEWCOL B13 (trade name, nonionic surfactant, manufactured by Nippon Nyukazai Co., Ltd.): | 300 g |
| EDTA 4Na (buffer): | 80 g |
| 2-Bromo-2-nitropropanediol: | 0.1 g |
| 2-Methyl-4-isothiazolin-3-one (pH = 9.7): | 0.1 g |

TABLE 4

| | (A) Binder polymer | Non-exposed region retention time (sec) | Exposed region development time (sec) | Development latitude (mS/cm) | Printing durability | Printing durability after burning | Development scum | Chemical resistance | Exposed region development time after forced aging (sec) |
|---|---|---|---|---|---|---|---|---|---|
| Example 123 | PN-16 | 31 | 10 | 10 | 1.1 | 1.4 | A | B | 10 |
| Example 124 | PN-18 | 31 | 9 | 10 | 1.3 | 1.6 | A | B | 9 |
| Example 125 | PN-20 | 24 | 8 | 12 | 1.6 | 1.9 | B | B | 8 |
| Example 126 | PN-34 | 31 | 8 | 12 | 1.6 | 1.9 | A | A | 8 |
| Example 127 | PN-38 | 24 | 8 | 12 | 1.6 | 1.9 | B | B | 8 |
| Example 128 | PN-39 | 24 | 8 | 12 | 1.6 | 1.9 | B | B | 8 |
| Example 129 | PN-40 | 24 | 8 | 12 | 1.6 | 1.9 | B | B | 8 |
| Example 130 | PN-41 | 30 | 8 | 12 | 1.7 | 2.0 | B | B | 8 |
| Example 131 | PN-42 | 30 | 8 | 12 | 1.7 | 2.0 | B | B | 8 |
| Example 132 | PN-43 | 30 | 8 | 12 | 1.7 | 2.0 | B | B | 8 |
| Example 133 | PN-44 | 31 | 8 | 12 | 1.6 | 1.9 | A | A | 8 |
| Example 134 | PN-45 | 31 | 8 | 12 | 1.6 | 1.9 | A | A | 8 |
| Example 135 | PN-46 | 31 | 8 | 12 | 1.6 | 1.9 | A | A | 8 |
| Example 136 | PN-47 | 31 | 11 | 11 | 1.5 | 1.8 | A | B | 11 |
| Example 137 | PN-48 | 30 | 8 | 12 | 1.5 | 1.8 | A | A | 8 |
| Example 138 | PN-49 | 30 | 8 | 12 | 1.5 | 1.8 | A | A | 8 |
| Example 139 | PN-50 | 30 | 8 | 12 | 1.5 | 1.8 | A | A | 8 |
| Com. Ex. 13 | PA-1 | 0 | 8 | — | 1.0 | 1.3 | A | C | 13 |
| Com. Ex. 14 | PB-1 | 0 | 10 | — | 1.1 | 1.4 | A | C | 15 |
| Com. Ex. 15 | PU-1 | 0 | 8 | — | 1.4 | 1.5 | C | D | 13 |

TABLE 5

| | Binder polymer | Non-exposed region retention time (sec) | Exposed region development time (sec) | Development latitude (mS/cm) | Printing durability | Printing durability after burning | Development scum | Chemical resistance | Exposed region development time after forced aging (sec) |
|---|---|---|---|---|---|---|---|---|---|
| Example 140 | PN-51 | 34 | 10 | 13 | 1.6 | 1.9 | A | B | 10 |
| Example 141 | PN-52 | 41 | 10 | 13 | 1.6 | 1.9 | A | B | 10 |
| Example 142 | PN-53 | 45 | 10 | 13 | 1.6 | 1.9 | A | B | 10 |
| Example 143 | PN-54 | 43 | 11 | 13 | 1.6 | 1.9 | A | B | 9 |
| Example 144 | PN-55 | 33 | 11 | 13 | 1.6 | 1.9 | B | B | 11 |
| Example 145 | PN-56 | 41 | 10 | 13 | 1.6 | 1.9 | A | B | 10 |
| Example 146 | PN-57 | 30 | 11 | 13 | 1.6 | 1.9 | B | B | 11 |
| Example 147 | PN-58 | 33 | 12 | 12 | 1.2 | 1.5 | A | B | 12 |
| Example 148 | PN-59 | 34 | 10 | 13 | 1.6 | 1.9 | A | A | 10 |
| Example 149 | PN-60 | 45 | 10 | 13 | 1.6 | 1.9 | A | A | 10 |

As is apparent from Tables 4 and 5, it is found that, even when development conditions were changed, solubility discrimination (i.e., the difference between the retention time of an unexposed region and developing time of an exposed region), development latitude and chemical resistance of the planographic printing plate precursor are improved while retaining the printing durability and suppressing development residue.

What is claimed is:

1. An image forming material comprising:

a support; and on the support, in this order, a lower layer and an upper layer whose solubility in an aqueous alkaline solution is increased by heat, the lower layer comprising a polymer, which has carboxylic acid groups at side chains thereof, and an infrared absorbing agent, at least a part of the carboxylic acid groups forming a salt structure with a monovalent basic compound, wherein:

the monovalent basic compound comprises onium hydroxide, and the polymer in which at least a part of the carboxylic acid groups thereof form a salt structure with the monovalent basic compound has a carboxylic acid value of from 0.001 mmol/g to 2.00 mmol/g, this value being the carboxylic acid value of the polymer in the form of a salt structure.

2. The image forming material according to claim 1, wherein the monovalent basic compound comprises a nitrogen-containing basic compound.

3. The image forming material according to claim 1, wherein the onium hydroxide comprises a compound having a structure represented by any one of the following Formulae (1) to (4):

(1)

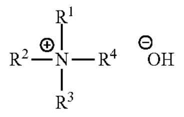

(2)

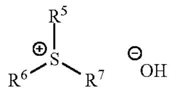

(3)

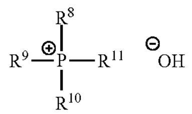

(4)

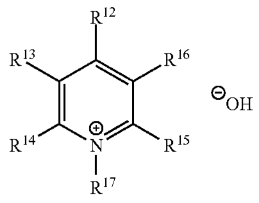

wherein, in Formulae (1) to (4), each of $R^1$ to $R^{17}$ independently represents a monovalent substituent; at least two of $R^1$ to $R^4$ may be bonded to each other to form a cyclic structure; at least two of $R^5$ to $R^7$ may be bonded to each other to form a cyclic structure; at least two of $R^8$ to $R^{11}$ may be bonded to each other to form a cyclic structure; and at least two of $R^{12}$ to $R^{17}$ may be bonded to each other to form a cyclic structure.

4. The image forming material according to claim 1, wherein the polymer which has carboxylic acid groups at side chains thereof has a main chain structure selected from the group consisting of an acrylic resin, an acetal resin and a polyurethane.

5. The image forming material according to claim 4, wherein the acrylic resin is a copolymer containing a structural unit derived from a monomer selected from the group consisting of an N-substituted maleimide and a (meth)acrylamide.

6. The image forming material according to claim 1, wherein the main chain structure of the polymer which has carboxylic acid groups at side chains thereof is a polyurethane.

7. The image forming material according to claim 1, wherein the polymer which has carboxylic acid groups at side chains thereof is a polymer obtained by applying and drying a coating liquid composition comprising a polymer (A-1) having carboxylic acid groups and a monovalent basic compound (A-2).

8. The image forming material according to claim 1, wherein the upper layer whose solubility in an aqueous alkaline solution is increased by heat comprises a water-insoluble and alkali-soluble resin.

9. The image forming material according to claim 1, wherein the upper layer whose solubility in an aqueous alkaline solution is increased by heat further comprises an infrared absorbing agent.

10. An infrared sensitive positive-working planographic printing plate precursor, comprising the image forming material according to claim 1.

11. A method for manufacturing a planographic printing plate, the method comprising, in the following order:

subjecting the infrared sensitive positive-working planographic printing plate precursor according to claim 10 to pattern exposure by an infrared ray; and developing the precursor using an aqueous alkaline solution having a pH of from 8.5 to 10.8.

12. The method for manufacturing a planographic printing plate according to claim 11, wherein the aqueous alkaline solution further comprises an anionic surfactant or a nonionic surfactant.

13. The image forming material according to claim 1, wherein the carboxylic acid value of the polymer in which at least a part of the carboxylic acid groups thereof form a salt structure with the monovalent basic compound is from 0.01 mmol/g to 1.80 mmol/g.

14. The image forming material according to claim 1, wherein the amount of the basic compound is from 15 mol % to 80 mol % with respect to 100 mol % of the carboxylic acid groups included in the polymer.

15. The image forming material according to claim 8, wherein the water-insoluble and alkali-soluble resin in the upper layer is a novolac phenol resin.

* * * * *